United States Patent [19]

Owada et al.

[11] Patent Number: 5,073,810
[45] Date of Patent: Dec. 17, 1991

[54] SEMICONDUCTOR INTEGRATED CIRCUIT DEVICE AND MANUFACTURING METHOD THEREOF

[75] Inventors: Nobuo Owada, Ohme; Hizuru Yamaguchi, Fussa; Sekiko Ozono, Ozono; Atsumi Yasuda, Tachikawa, all of Japan

[73] Assignee: Hitachi, Ltd., Tokyo, Japan

[21] Appl. No.: 600,363

[22] Filed: Oct. 19, 1990

[30] Foreign Application Priority Data

Nov. 7, 1989 [JP] Japan ................................. 1-289809
Nov. 7, 1989 [JP] Japan ................................. 1-289810

[51] Int. Cl.$^5$ ...................... H01L 29/72; H01L 29/4; H01L 27/12
[52] U.S. Cl. ........................................ 357/34; 357/59; 357/4
[58] Field of Search .................. 357/59, 34, 4; 437/99

[56] References Cited

U.S. PATENT DOCUMENTS 4,725,874 2/1988 Ooga et al. .................. 357/59 H

*Primary Examiner*—Mark Prenty
*Attorney, Agent, or Firm*—Pennie & Edmonds

[57] ABSTRACT

A semiconductor integrated circuit device having at least one bipolar transistor comprises a semiconductor substrate of monocrystalline silicon having a main surface; an isolation oxide layer selectively formed on the main surface so as to surround an active region of the main surface; a first silicon layer formed on the active region and extending on the isolation oxide layer and a second silicon layer stacked on the first silicon layer, wherein a collector region of a bipolar transistor is formed on the active region of the first silicon layer, the intrinsic base region is formed on the active region of the second silicon layer, and a base-lead out region which is electrically connected with the intrinsic base region is formed of the first and second silicon layers over the isolation oxide layer.

7 Claims, 13 Drawing Sheets

SEMICONDUCTOR INTEGRATED CIRCUIT DEVICE AND MANUFACTURING METHOD THEREOF

BACKGROUND OF THE INVENTION

The present invention concerns a semiconductor integrated circuit device and, more in particular, it relates to a technique which is useful for applying to a semiconductor circuit integrated circuit device having a bipolar transistor.

A bipolar transistor employing a structure of EBT (Epitaxial Base Transistor) by using the technique of SPEG (Selective Poly- and Epitaxial-silicon Growth) has been reported by F. Mieno, et al (1987, IEDM, Session 2.2, PP16-19).

In the bipolar transistor employing the EBT structure, a base region is constituted with a p type semiconductor region formed to a single crystal silicon film deposited on the main surface of an n type collector region disposed in a semiconductor substrate of monocrystalline silicon. A base lead-out electrode comprising a polycrystalline silicon film introduced with a p type impurity at high concentration is electrically connected to the periphery of the base region. The base lead-out electrode is extended on an field insulation film formed on the semiconductor substrate by means of local oxidation of silicon (LOCOS) method. The base region and the base lead-out electrode are formed by using a production process inherent to the EBT structure reported as described above (SPEG technique) and they are formed in one identical production process. That is, the base region and the base lead-out electrode are formed simultaneously with a silicon film deposited on a collector region and a field insulation film by means of a CVD (Chemical Vapor Deposition) method. Among the silicon films, the silicon film deposited on the collector region is monocrystalline since the semiconductor substrate on which the collector region is formed comprises a monocrystalline silicon and this silicon film is used as the base region. On the other hand, the silicon film deposited on the field insulation film is polycrystalline since the field insulation film is amorphous and this silicon film is used as the base lead-out electrode.

An emitter region is constituted with the n type semiconductor region formed on the main surface of the base region.

In the bipolar transistor adopting the EBT structure, since the junction depth of the base region can be set with the thickness of the monocrystalline silicon film grown on the collector region, the junction depth of the base region can be made shallow. That is, since the parasitic capacitance added to the base region can be reduced, the operation speed of the bipolar transistor can be increased.

SUMMARY OF THE INVENTION

The present inventor has found the following problems in view of further higher speed operation and electric reliability, in particular, α-ray soft error resistance in the bipolar transistor adopting the EBT structure as described above.

At first, the result of study which was made in view of the high speed operation will be explained at first.

In the bipolar transistor adopting the EBT structure described above, each of the base region and the base lead-out electrode is formed by an identical production process, that is, with an identical silicon film. The silicon film is formed at a reduced film thickness so as to make the junction depth of the base region shallow thereby reducing the parasitic capacitance. That is, since the thickness of the silicon film is determined on the basis of the junction depth of the base region, the film thickness of the base lead-out electrode is reduced. Accordingly, since the resistance value of the base lead-out electrode is increased, to increase the serial base resistance ($r_{bb'}$), there is a problem that the operation speed of the bipolar transistor adopting the EBT structure is lowered.

In view of the above, the present inventors have made a study on the technique of forming the silicon film with an increased thickness based on the film thickness of the base lead-out electrode in order to overcome the lowering of the operation speed.

According to the technique studied by the present inventors, the base region is formed in a particle region on the side of the surface of the silicon film formed by the SPEG technology and formed with a shallow junction depth. The portion below the base region of the silicon film is formed as an intrinsic collector region with an aim of reducing the parasitic capacitance $C_{TC}$ between the base and the collector formed relative to the base lead-out electrode. The intrinsic collector region is formed at a lower impurity concentration as compared with a collector region at high concentration formed to the main surface of the semiconductor substrate. Then, since the resistance value at a portion of a collector current path is increased in the intrinsic collector region, this brings about a problem that the operation speed is reduced in the bipolar transistor adopting the EBT structure.

Furthermore, the present inventors have set the impurity concentration higher for the intrinsic collector region below the base region in order to overcome the lowering of the operation speed due to the increase of the resistance value. The impurity concentration in the intrinsic collector region is controlled by introducing an n type impurity from the surface of the silicon film by means of ion implantation. Since the n type impurity is introduced into a deep region below the base region of the silicon film, the ion implantation is conducted by using a great amount of energy. Accordingly, crystal defects are formed in the silicon film due to the introduction of the n type impurity. Further, since the impurity is introduced to the deep region of the silicon film at high energy, the profile of the impurity concentration becomes broad to reduce the controllability. As the result, the production yield of the bipolar transistor is lowered.

Further, in the bipolar transistor adopting the EBT structure, a collector region (intrinsic collector, high density collector buried layer) is formed over a wide range in the p type semiconductor substrate. The reason why the collector region is disposed over a wide range the collector contacts has to be made from the upper surface of the semiconductor substrate. That is, a parasitic capacitance ($C_{TS}$) formed at the pn junction between the collector region and the semiconductor substrate is increased, and this reduces the operation speed of the bipolar transistor.

Further, in the bipolar transistor adopting the EBT structure, the silicon film with which the base region is formed is in direct contact on the collector region. For reducing the parasitic capacitance ($C_{TC}$) formed at the pn junction between the collector region and the base region and increasing the operation speed of the bipolar transistor, it is necessary to set the impurity concentration lower for the collector region and the base region. However, the serial base resistance and collector resistance ($r_{cs}$) are increased in this case and the operation speed of the bipolar transistor is lowered due to the increase of such resistance. That is, it is not possible to simultaneously improve the parasitic capacitance ($C_{TC}$), serial base resistance ($r_{BB'}$) and the collector resistance ($r_{CS}$) respectively, to increase the operation speed of the bipolar transistor.

The result of the study which was made in view of the electric reliability, particularly, $\alpha$-ray soft error resistance will then be described next.

The bipolar transistor adopting the EBT structure is used as a device for constituting a logic circuit or a memory circuits. Generally, when $\alpha$-rays pass through a depletion layer formed at the pn junction between the collector region and the semiconductor substrate of a bipolar transistor, a lot of electron-hole pairs are formed along the trace of the $\alpha$-rays in the depletion region and after the passage through the depletion region. Among the electron-hole pairs electrons move toward the semiconductor substrate and the holes move toward the collector region under the electric field in the depletion region. In particular, holes (minor carriers) moved toward the collector region are trapped by the collector region to fluctuate the collector potential and, as a result, causes misoperation in the bipolar transistor. That is, so-called $\alpha$-ray soft errors are caused. In the bipolar transistor adopting the EBT structure, the pn junction between the collector region and the semiconductor substrate is formed over a wide range and the depletion region formed in the pn junction also extends over a wide range. That is, since the depletion region is formed over a wide range in the bipolar transistor of this kind, probability of $\alpha$-ray incidence is increased to increase those rate of occurrence of $\alpha$-ray soft errors. As a technique for reducing the rate of occurrence of the $\alpha$-ray soft errors, SOI (Silicon On Insulator) technique has been studied and developed. According to the SOI technique, a semiconductor device, for example, a bipolar transistor is formed by way of an insulation film on a semiconductor substrate. That is, in the bipolar transistor adopting the SOI technique, the collector region can be isolated substantially completely from the semiconductor substrate. The carrier mobility in the insulation film used for the isolation is much lower as compared with that of the semiconductor substrate and, if electron-hole pairs are formed in the semiconductor substrate upon incidence of $\alpha$-rays, the insulation film constitutes a shielding field and the holes are not trapped in the collector region. That is, since potential fluctuation of the collector region does not occur in the bipolar transistor, the SOI technique can improve the $\alpha$-ray soft error resistance.

However, in the SOI technique, most part of the bipolar transistor is surrounded with the insulation film on the semiconductor substrate and the field insulation film at the periphery of the bipolar transistor respectively. Each of the insulation film on the semiconductor substrate and the field insulation film, if formed for example with a silicon oxide film, has heat conductivity which is lower by more than two digits as compared with that of silicon and, as a result, heat dissipation path of the bipolar transistor to the semiconductor substrate is interrupted. Further, the amount of heat generated per unit area is increased in the bipolar transistor due to the increase of the electric power consumption accompanying the increased degree of integration and increased operation speed. Therefore, the operation temperature of the bipolar transistor is greatly elevated to deteriorate electrical characteristics. Further, due to the increase in the amount of heat generated, reliability of multi-layered wiring structure such as electromigration resistance of wirings connected to the bipolar transistor or wirings extended on the upper layer, for example, aluminum alloy wirings are deteriorated.

The present invention has been accomplished in order to overcome the foregoing problems.

It is an object of the present invention to provide a technique capable of increasing the operation speed of a semiconductor integrated circuit device.

Another object of the present invention is to provide a technique capable of improving the production yield of a semiconductor integrated circuit device.

A further object of the present invention is to provide a technique capable of increasing the operation speed of a semiconductor integrated circuit device.

A further object of the present invention is to provide a technique capable of improving the $\alpha$-ray soft error resistance of a semiconductor integrated circuit device.

A further object of the present invention is to provide a technique capable of improving a heat dissipation efficiency of a semiconductor integrated circuit device.

A further object of the present invention is to provide a technique capable of shortening the period of time for developing a semiconductor integrated circuit device.

A further object of the present invention is to provide a technique capable of reducing the number of steps for producing a semiconductor integrated circuit device.

The objects and novel features of the present invention will become apparent by reading the descriptions in the present specification and accompanying drawings.

The outline of typical inventions among those disclosed in the present application will now be explained briefly as below.

In a semiconductor integrated circuit device having a bipolar transistor in which a base lead-out electrode is connected to a base region at the periphery portion there of, a dual layered silicon film having a first silicon film and a second silicon film each formed successively in the active region (mainly, collector region) and in the inactive region (mainly, field insulation film forming region) on a substrate, a base is formed in the active region of the upper second silicon film of the dual layered silicon film and a base lead-out electrode is formed in each of the inactive regions of the first silicon film and the second film, the active region for each of the first silicon film and the second silicon film of the dual layered silicon films is monocrystalline and the inactive region in each of the first silicon film and the second silicon film of the dual layered silicon films is polycrystalline.

In a semiconductor integrated circuit device having bipolar transistor in which a collector region, a base region and an emitter region are formed in the active region on a substrate, and a base lead-out electrode is formed in the inactive region on the substrate and connected to the periphery of the base region, a dual layered silicon film having a first silicon film and a second silicon film each formed successively in the active region and in the inactive region on the substrate are formed, the emitter region, the base region and the collector region are disposed to the first silicon film and the second silicon film in the active region of the dual layered silicon film, thereby forming a bipolar transistor, and the base lead-out electrode is formed to the first silicon film and the second silicon film in the inactive region of the dual layered silicon film.

Further, the second silicon film of the dual layered silicon film is formed with a compound of silicon and germanium and the emitter region is formed on the main surface of the base region formed in the second silicon film.

In a semiconductor integrated circuit device having a bipolar transistor of vertical structure in which a collector region, a base region and an emitter region are respectively formed in the active region on a substrate successively from the side of the surface of the substrate, a dual layered silicon film having a first silicon film and a second silicon film each formed successively in the active region on the substrate are formed, an intrinsic collector region is formed to the first silicon film of the dual layered silicon films, the base region and the emitter region formed to the second silicon film from the side of the first silicon film successively and a semiconductor region (pedestal collector region) of a conduction type identical with that of the intrinsic collector region and at a higher impurity concentration then that in the intrinsic collector region is formed to the main surface, on the side of the second silicon film, of the intrinsic collector region formed in the first silicon film.

Further, the planar shape for the pedestal collector region has substantially the same size as compared with the planar shape for the emitter region.

In a method of manufacturing a semiconductor integrated circuit device having a bipolar transistor of vertical structure in which a collector region, a base region and an emitter region are respectively formed in the active region on a substrate successively from the side of the surface of said substrate, the method comprises a step of forming a first silicon film in the active region on the substrate and forming an intrinsic collector region in the first silicon film, a step of introducing impurities of a conduction type identical with that of the intrinsic collector region by means of ion implantation into the main surface of the intrinsic collector region and forming a semiconductor region (pedestal collector region) at a higher impurity concentration as compared with that in the intrinsic collector region and a step of forming a second silicon film on the first silicon film and forming a base region and an emitter region respectively in the second silicon film successively from the side of the first silicon film.

A semiconductor integrated circuit device having a bipolar transistor of vertical structure, in which a collector region, a base region and an emitter region are respectively formed in the active region on a substrate successively from the side of the surface of the substrate, and a base lead-out electrode connected to a base region at a periphery portion thereof is formed in the inactive region on the substrate, a dual layered silicon films is formed by forming the first silicon film and the second silicon film respectively in the active region and the inactive region on the substrate successively, an intrinsic collector region is formed in the active region of the first silicon film of the dual layered silicon film, the base region and the emitter region are respectively formed in the active region of the second silicon film successively from the side of the silicon film, a semiconductor region of the conduction type identical with that of the intrinsic collector region and at a higher impurity concentration as compared with that in the intrinsic collector region is formed to the main surface in the intrinsic collector region formed in the first silicon film, on the side of the second silicon film, and the base lead-out electrode is formed to each of the inactive regions of the first silicon film and the second silicon film.

In a semiconductor integrated circuit device having a bipolar transistor of vertical structure in which a collector region is formed on a silicon substrate which is a device isolation region, wherein a collector lead-out electrode formed with an identical silicon film with that of the collector region is disposed at least to a periphery portion of the collector region of the bipolar transistor of vertical structure and an insulator is formed between the collector lead-out electrode and the silicon substrate. The silicon substrate is monocrystalline, the collector region is formed with a monocrystalline silicon and the collector lead-out electrode is formed with a polycrystalline silicon respectively.

In a semiconductor integrated circuit device having a bipolar transistor of vertical structure in which a collector region is formed on a silicon substrate which is a device isolation region, wherein a collector lead-out electrode formed with an identical silicon film with that of the collector region is disposed at least to a periphery portion of the collector region of the bipolar transistor of vertical structure, and substantially the entire area on the surface of the collector lead-out electrode is covered with an insulator.

In a semiconductor integrated circuit device having a bipolar transistor in which a base lead-out electrode is connected to the periphery portion of a base region, wherein the base region and the base lead-out electrode of the bipolar transistor are formed with an identical silicon film and the junction depth for the base region is made shallower as compared with the thickness of the base lead-out electrode. The base region is formed with monocrystalline silicon and the base lead-out electrode is formed with a polycrystalline silicon respectively.

A semiconductor integrated circuit device having a bipolar transistor of vertical structure in which a collector region and a base region are respectively formed in the vertical direction on a silicon substrate which is a device isolation region, wherein a collector lead-out electrode formed with an identical silicon film with that of the collector region is formed at least to a periphery porotion of the collector region of the bipolar transistor of vertical structure, a base lead-out electrode formed with an identical silicon film with the base region is disposed at least to a periphery portion of the base region, an insulator is formed between the collector lead-out electrode and the silicon substrate, and an insulator is disposed between the collector lead-out electrode and the base lead-out electrode. The insulator is made of a silicon oxide film or silicon nitride film.

Each of the planar shape for an opening defined at the periphery thereof with the insulator for connecting the collector region and the silicon substrate and the planar shape for the opening defined at the periphery thereof with the insulator for connecting the collector region and the base region is formed to such a shape that is formed by a treatment of widening by a predetermined amount of size relative to the planar shape for the emitter region of the bipolar transistor of vertical structure.

In a semiconductor integrated circuit device having a bipolar transistor of vertical structure in which a collector region is formed on a silicon substrate which is a device isolation region, wherein a collector lead-out electrode formed with an identical silicon film with the collector region is disposed at least to a periphery of the collector region of the bipolar transistor of vertical structure, an insulator is disposed between the collector lead-out electrode and the silicon substrate and a burying insulator is formed at the inside of the silicon substrate below the collector region.

The burying insulator on the side of the surface of the silicon substrate is formed in a range from the surface of the silicon substrate to a position in contact with a depletion region formed from the pn junction between the silicon substrate and the collector region to the side of the silicon substrate.

In a method of manufacturing a semiconductor integrated circuit device having a bipolar transistor of vertical structure in which a collector region is formed on a silicon substrate which is a device isolation region, the method comprises a step of forming an insulator at the periphery of a region for forming the collector region on the silicon substrate, a step of depositing a silicon film by means of a CVD process on the insulator and on the silicon substrate which is exposed and being surrounded at the periphery thereof with the insulator and a step of introducing impurities with the conduction type opposite to that of the silicon substrate into each of the silicon film on the insulator and the silicon film on the silicon substrate, forming a collector lead-out electrode with the silicon film on the insulator and forming a collector region with the silicon film on the silicon substrate.

In a method of manufacturing a semiconductor integrated circuit device having a bipolar transistor of vertical structure in which a collector region and a base region are respectively formed vertically on a silicon substrate successively which is a device isolation region, the method comprises a step of forming an insulator at the periphery of a region for forming the collector region on the silicon substrate, a step of depositing a silicon film by means of a CVD process on the insulator and on the silicon substrate which is exposed and being surrounded at the periphery thereof with the insulator, a step of introducing impurities of the conduction type opposite to that of the silicon substrate into each of the silicon film on the insulator and the silicon film on the silicon substrate, forming a collector lead-out electrode with the silicon film on the insulator and forming a collector region with the silicon film on the silicon substrate, a step of forming an insulator on the collector lead-out electrode, a step of depositing a silicon film by means of a CVD process on the insulator and on the collector region which is exposed and being surrounded at the periphery thereof with the insulator, and a step of introducing impurities of the conduction type opposite to that of the collector region into the silicon film on the insulator and the silicon film on the collector region respectively, forming the base lead-out electrode with the silicon film on the insulator and forming the base region with the silicon film on the collector region respectively.

The silicon film deposited on the collector region and on the insulator surrounding the periphery of the collector region is formed in a state not introduced with the impurities or with an opposite electroconduction type to that of the base region and, subsequently, impurities forming the base region are introduced to the main surface on the collector region of the silicon film thereby forming the base region.

According to the constitution of the present invention as described above, since the junction depth of the base region is defined by the thickness of the second silicon film as the upper layer of the silicon films of the two layer structure, and the depth of the junction can be made shallow to improve the transportation efficiency of the carriers between the emitter region and the collector region, the cut-off frequency ($f_T$) of the bipolar transistor can be improved to increase the operation speed of the semiconductor integrated circuit device. Further, since the film thickness of the base lead-out electrode is defined by the first silicon film and the second silicon film of the two layered silicon film, thereby increasing the film thickness of the base lead-out electrode and reducing the resistance value of the base lead-out electrode to reduce the serial resistance of the base current path ($r_{bb'}$), it is possible to increase the operation speed of the bipolar transistor and increase the operation speed of the semiconductor integrated circuit device.

In addition, since the second silicon film is formed with a compound film of silicon and germanium, the impurity concentration in the base region can be further increased and the serial resistance of the base current path can further be reduced, in addition to the effect as described above. Accordingly, it is possible to increase the operation speed of the bipolar transistor and increase the operation speed of the semiconductor integrated circuit device. Further, since the impurity concentration in the emitter region of the bipolar transistor can be lowered and the parasitic capacitance formed between the emitter region and the base region can be reduced to decrease the parasitic capacitance added to each of the emitter region and the base region, it is possible to increase the operation speed of the bipolar transistor and increase the operation speed of the semiconductor integrated circuit device.

Further, each of the junction depth for the emitter region and the base region is defined by the thickness of the second silicon film of the two layered silicon film and the junction depth thereof can be made shallow to increase the carrier transportation efficiency between the emitter region and the collector region, it is possible to improve the cut-off frequency ($f_T$) of the bipolar transistor of vertical structure and increase the operation speed of the semiconductor integrated circuit device. Further, since the profile of the impurity concentration at the pn junction between the base region and the semiconductor region can be made steep (the slope of the impurity concentration is made steep) to increase the electric field intensity at the pn junction, running time of carriers between the emitter region and the collector region can be shortened, and it is possible to increase the operation speed of the bipolar transistor of vertical structure and increase the operation speed of the semiconductor integrated circuit device. Further, since the resistance for a portion of the collector current path in the collector region can be reduced in the semiconductor region and the running time of the carriers can be shortened, it is possible to increase the operation speed of the bipolar transistor of vertical structure and increase the operation speed of the semiconductor integrated circuit device.

Further, since the parasitic capacitance ($C_{TC}$) formed to the pn junction between the semiconductor region and the base region can be minimized, it is possible to increase the operation speed of the bipolar transistor of vertical structure and increase the operation speed of the semiconductor circuit integrated circuit device.

Further, since the collector region is formed to the first silicon film and the base region, the emitter region are formed to the second silicon film respectively and an impurity forming the semiconductor region can be introduced into the shallow region of the intrinsic collector region of the first silicon film, the amount of energy for introducing the impurities can be reduced. As a result, it is possible to reduce the amount of occurrence of crystal defects and the knock-on phenomenon in the first silicon film to improve the production yield of the semiconductor integrated circuit device. Further, since the amount of energy for introducing the impurities is reduced and the impurities are introduced into the shallow region at the surface of the first silicon film the controllability for the profile of the impurity concentration in the semiconductor region can be improved. Furthermore, since the amount of occurrence of crystal defects due to the introduction of the impurities can be reduced and the controlability of the profile for the impurity concentration can be improved in the semiconductor region, the impurity concentration can be increased and the resistance value of the collector current path can further be reduced.

Further, since the parasitic capacitance formed between the collector lead-out electrode and the silicon substrate can be reduced and the parasitic capacitance ($C_{TS}$) added to the collector region of the bipolar transistor of the vertical structure can be reduced, it is possible to increase the operation speed of the bipolar transistor of the vertical structure and increase the operation speed of the semiconductor integrated circuit device. Further, since the area of the depletion region formed to the pn junction between the collector region and the collector lead-out electrode, and the silicon substrate can be reduced by so much as the area for the collector lead-out electrode, the probability that minor carriers are trapped by the incidence of $\alpha$-rays in the silicon substrate can be reduced to improve the $\alpha$-ray soft error resistance of the semiconductor integrated circuit device. Furthermore, since a heat dissipation path leading from the collector region to the silicon substrate is formed just below the collector region, the heat dissipation efficiency for the heat generated by the operation of the bipolar transistor of vertical structure can be improved.

Further, since addition of the parasitic capacitance formed between the electroconductive film at the periphery of the collector lead-out electrode and the collector region to the collector lead-out electrode can be reduced, it is possible to reduce the parasitic capacitance added to the collector region of the bipolar transistor of vertical structure and improve the operation speed of the semiconductor integrated circuit device.

Further, since the resistance value of the base lead-out electrode can be reduced to decrease the serial resistance ($r_{bb'}$) of the base current path, it is possible to increase the operation speed of the bipolar transistor and increase the operation speed of the semiconductor integrated circuit device. Furthermore, since it is possible to make the profile for the impurity concentration in the base region steep, thereby increasing the intensity of the electric field formed to the pn junction between the base region and the collector region, and improve the carrier transportation efficiency, it is possible to improve the cut-off frequency ($f_T$) of the bipolar transistor and increase the operation speed of the semiconductor intergrated circuit device.

Further, since the parasitic capacitance formed between the collector lead-out electrode and the base lead-out electrode can be reduced to thereby reduce the parasitic capacitance added to each of the collector region and the base region of the bipolar transistor of vertical structure, it is possible to increase the operation speed of the bipolar transistor of vertical structure and increase the operation speed of the semiconductor integrated circuit device. Further, the base lead-out electrode and the collector lead-out electrode can be isolated by the insulator and the impurity concentration profile for the base lead-out electrode can be increased independently of the collector lead-out electrode. As a result, since it is possible to decrease the resistance value of the base lead-out electrode and decrease the serial resistance of the base current path, it is possible to increase the operation speed of the bipolar transistor of vertical structure and increase the operation speed of the semiconductor integrated circuit device.

Further, since the shape of the opening defined for the periphery with the insulator, that is, a substantial planar shape of the base region and/or of the collector region can be defined by merely applying lessening treatment or broadening treatment for the planar shape of the emitter region, graphic treatment can be simplified and the time required for the development of the semiconductor integrated circuit device can be shortened.

Further, since intrusion of minor carriers generated upon incidence of $\alpha$-rays in the silicon substrated into the collector region can be shielded and the amount of the minor carriers trapped in the collector region can be reduced, it is possible to improve the $\alpha$-ray soft error resistance of the semiconductor integrated circuit device.

Further, since the parasitic capacity formed to the pn junction between the silicon substrate and the collector region can be reduced by so much as the buried insulator, and the parasitic capacitance added to the collector region of the bipolar transistor of vertical structure can be reduced, it is possible to increase the operation speed of the bipolar transistor of vertical structure and increase the operation speed of the semiconductor integrated circuit device.

Further, since the collector lead-out electrode can be formed in the step of forming the collector region of the bipolar transistor of vertical structure, the number of production steps for the semiconductor integrated circuit device can be reduced by so much as the step for forming the collector lead-out electrode.

Further, since the base lead-out electrode can be formed in the step of forming the base region of the bipolar transistor of vertical structure, the number of production steps for the semiconductor integrated circuit device can be reduced by so much as the step for forming the base lead-out electrode.

Further, each of the base region and the base lead-out electrode can be formed independently of each other and the base region can be formed with a shallow junction, while the base lead-out electrode can be formed with an increased film thickness as compared with the junction for the base region. As a result, the cut-off frequency of the bipolar transistor of vertical structure can be improved and the serial resistance of the base current path can be decreased. Accordingly, it is possible to increase the operation speed of the bipolar transistor of vertical structure and increase the operation speed of the semiconductor integrated circuit device.

DESCRIPTION OF A PREFERRED EMBODIMENT

Figure 1:
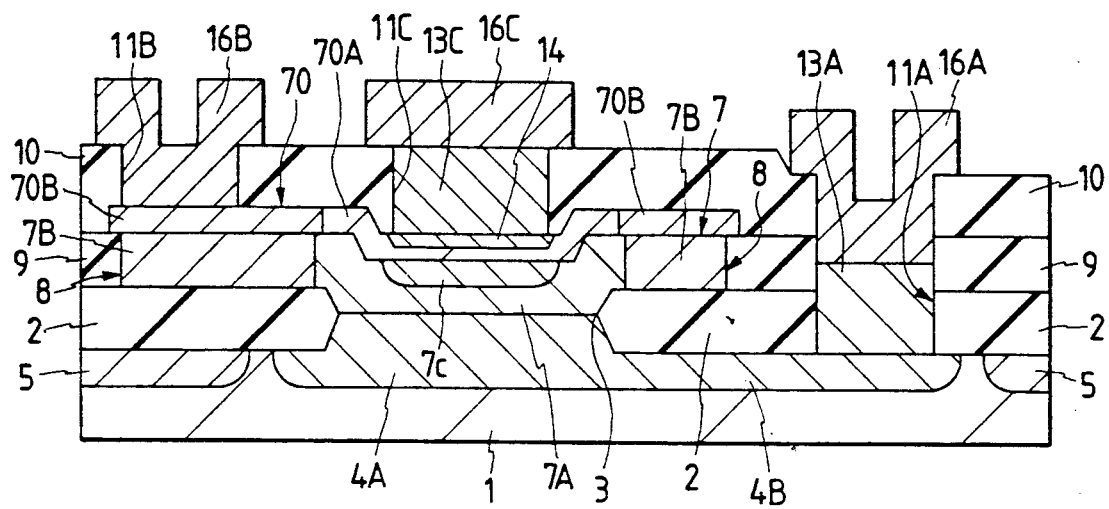
FIG. 1 is a cross sectional view for a portion illustrating a constitution of a bipolar transistor as a first embodiment according to the present invention.

Explanation will now be made to the constitution of the present invention with reference to one embodiment in which the present invention is applied to a semiconductor integrated circuit device having a bipolar transistor of vertical structure.

In each of the figures for describing the embodiment, those having identical functions carry the same reference numerals, for which duplicate explanations are omitted.

FIRST EMBODIMENT

A semiconductor integrated circuit device as a first embodiment according to the present invention will be explained referring to FIG. 1 (cross sectional view for a portion) and FIG. 2 (plan view for a portion).

Figure 2:
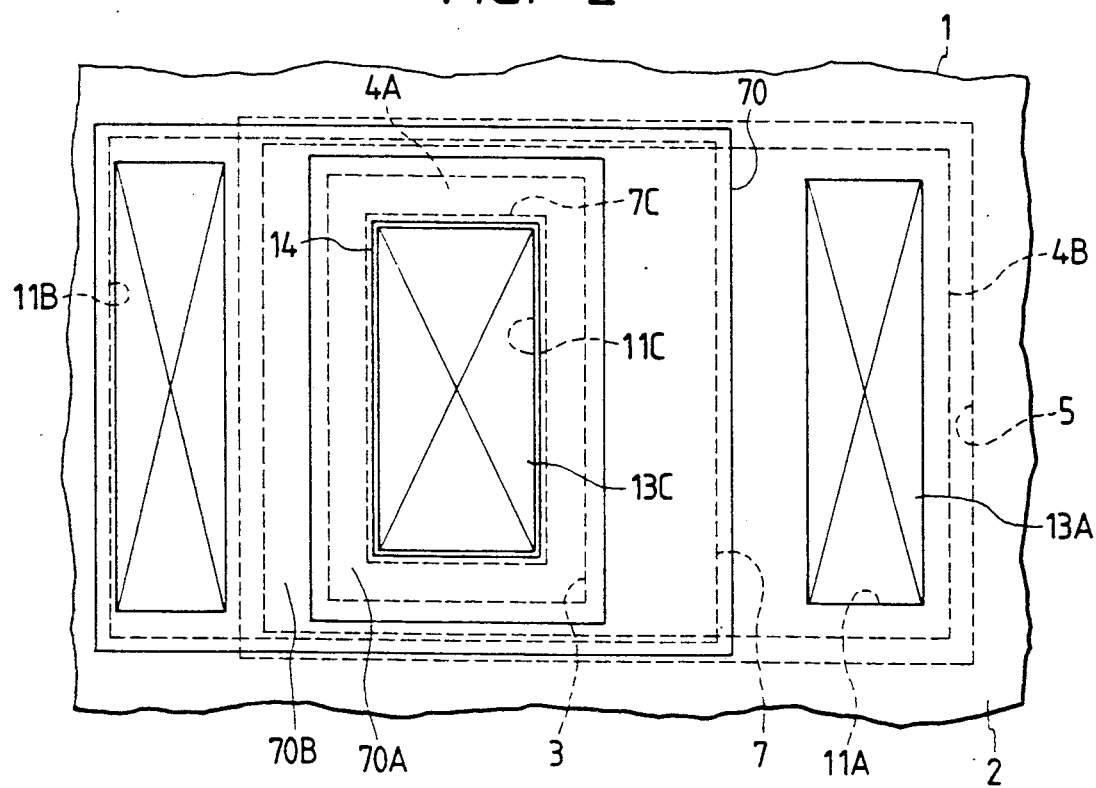
FIG. 2 is a plan view for a portion corresponding to the bipolar transistor shown in FIG. 1.

As shown in FIGS. 1 and 2, a semiconductor integrated circuit device is constituted on a p$^-$ type semiconductor substrate 1 made of a monocrystalline silicon. Within a region surrounded with a device isolation region, a bipolar transistor of vertical structure is constituted on an active region of the p$^-$ type semiconductor substrate 1. The bipolar transistor of vertical structure comprises an n type collector region, a p type base region and n type emitter region. The n type collector region, the p type base region and the n type emitter region are respectively arranged successively from the main surface of the p$^-$ type semiconductor substrate 1 in the vertical direction.

The device isolation region mainly comprises the p$^-$ type semiconductor substrate 1, an insulator (field insulation film) 2, a p$^+$ type semiconductor region 4 G, a groove 8 and a burying insulator 9. The p$^-$ type semiconductor substrate 1 and the lower portion of the bipolar transistor of vertical structure, that is, an n type collector region 4A are applied with a bias voltage opposite to each other and isolated electrically from each other. For instance, a potential $-V_{EE}$ (for instance, $-5.4$"V") which is the lowest among the potentials applied to the semiconductor integrated circuit device is applied to the p$^-$ type semiconductor substrate 1, while the ground potential $V_{CC}$ (for example, 0"V") is applied to the n type collector region 4A. The insulator 2 is disposed on the main surface of an inactive region of the p$^-$ type semiconductor substrate 1 and electrically isolating the n type collector region 4A and the semiconductor region or the electroconductive layer formed on the main surface of the p$^-$ type semiconductor substrate 1 electrically from each other. Further, the insulator 2 electrically isolates the collector lead-out region 4B and base lead-out electrodes (base lead-out region) 7B, 70B. The p$^+$ type semiconductor region 4G is disposed on the main surface of the inactive region of the p$^-$ type semiconductor substrate 1 and electrically isolating the n type collector region 4A and the collector lead-out region 4B and the n type semiconductor region of other device (not illustrated) formed on the main surface of the p$^-$ type semiconductor substrate 1. The groove 8 and the burying insulator 9 surround the periphery of the base lead-out electrode 7B for electrically isolating the base lead-out electrode and other electroconductive layer (for example, collector lead-out electrode 13A).

The collector region of the bipolar transistor of vertical structure mainly comprises the n$^+$ type semiconductor region (n$^+$ type buried layer) 4A, a n type semiconductor region (intrinsic collector region) 7A and an n$^+$ type semiconductor region (collector pedestal region) 7C. The n$^+$ type semiconductor region 4A is disposed to the main surface of the active region of the p$^-$ type semiconductor substrate 1. The n type semiconductor region 7A is formed in a silicon film 7 disposed on the n$^+$ type semiconductor region 4A as the n type collector region. The n$^+$ type semiconductor region 7A (the active region of the silicon film 7) is formed with a monocrystalline silicon, and the lower surface thereof is in direct contact with the n$^+$ type semiconductor region 4A. The connection for each of the n type semiconductor region 7A and the n$^+$ type semiconductor region 4A is made through an opening 3 which is defined at the periphery thereof with the insulator 2 disposed on the main surface of the inactive region of the p$^-$ type semiconductor substrate 1. The n$^+$ type semiconductor region 7C is disposed in the main surface of the n type semiconductor region (intrinsic collector region) 7A, that is, in the silicon film 7. The n$^+$ type semiconductor region 7C is formed at a higher impurity concentration as compared with the n type semiconductor region 7A. Accordingly, the n$^+$ type semiconductor region 7C can make the profile of the impurity concentration steep at the pn junction with respect to the p type base region (p type semiconductor region 70A) (make the slope of the impurity concentration steep). Further, the n+ type semiconductor region 7C can decrease the resistance value of the collector current path.

At the periphery of the n+ type semiconductor region 4A of the n type collector region, a collector lead-out region 4B is disposed with its one end being electrically connected with the side of the n+ semiconductor region 4A. The collector lead-out region 4B is disposed to the main surface of the inactive region of the p− type semiconductor substrate 1, formed by an n+ type semiconductor region of an identical layer with the n+ type semiconductor region 4A and integrally constituted with the n+ type semiconductor region 4A. As shown in FIGS. 1 and 2, the collector lead-out region 4B is disposed along the periphery of the n+ type semiconductor region 4A. The other end of the collector lead-out region 4B is connected by way of a collector lead-out electrode 13A to a collector wiring 16A. Each of the collector lead-out region 4B and the electrode 13A is disposed with an aim of supplying the collector current for the bipolar transistor of vertical structure from the side of the surface of the p− type semiconductor substrate 1.

The collector lead-out electrode 13A is connected through a collector opening 11A formed in the insulators 2, 9 and an insulator film 10 to the collector lead-out region 4B. The collector lead-out electrode 13A is formed, for example, with a monocrystalline silicon film (or polycrystalline silicon film) and n type impurities are introduced into the monocrystalline silicon film for decreasing the resistance value.

The wiring 16A is formed, for example, with aluminum or aluminum alloy. In the aluminum alloy, Cu or Cu and Si is added to aluminum.

The p type base region is constituted with a p type semiconductor region (intrinsic base region) 70A. The p type semiconductor region 70A is constituted with a silicon film 70 formed on the n+ type semiconductor region 7C which is at least substantial operation region of the n type collector region, that is, on the silicon film 7. The p type semiconductor region 70A is monocrystalline and the lower surface thereof is in direct contact with the surface of the n− type semiconductor region 7C. The silicon film 70 constituting the p type semiconductor region 70A is formed with a layer different from the silicon film 7 constituting the n type semiconductor region 7A and the n+ type semiconductor region 7C.

At the periphery of the p type semiconductor region 70A as the p type base region, base lead-out electrodes 7B and 70B are formed with one end thereof being electrically connected to the side of the p type semiconductor region 70A. The base lead-out electrodes 7B and 70B are constituted with a dual layer structure of the silicon film 7 and the silicon film 70 and they are integrally formed with the p type semiconductor region 70A. The base lead-out electrodes 7B and 70B are disposed on the collector lead-out region 4B by way of the insulator 2 and respectively formed with the identical silicon layers for the p type semiconductor region 70A and the n type semiconductor region 7A, but is polycrystalline. As shown in FIGS. 1 and 2, the base lead-out electrodes 7B and 70B are disposed along the entire region at the periphery of the p type semiconductor region 70A. The other ends of the base lead-out electrodes 7B and 70B are connected with a base wiring 16B. The connection for each of the base lead-out electrodes 7B and 70B and the wiring 16B is conducted through a base opening 11B formed in the insulation film 10.

The n type emitter region is constituted with an n+ type semiconductor region 14. The n+ type semiconductor region 14 is formed in the main surface of the p type semiconductor region 70A, which is p type base region, that is, on the surface of the silicon film 70. The n+ type semiconductor region 14 is monocrystalline.

An emitter lead-out electrode 13C is connected on the main surface of the n+ semiconductor region 14 as the n+ emitter region. The emitter lead-out electrode 13C is formed with the monocrystalline silicon film (or polycrystalline silicon film) of the identical layer with the collector lead-out electrode 13A, and n type impurities are introduced into the monocrystalline silicon film for decreasing the resistance value. The emitter lead-out electrode 13C is connected through an emitter opening 11C formed in the insulation film 10 to the main surface of the n+ semiconductor region 14. The n+ semiconductor region 14 as the n+ emitter region is formed by introducing n+ impurities by means of a drive-in diffusion method from the emitter lead-out electrode 13C to the main surface of the p type semiconductor region 70A. The emitter lead-out electrode 13C is connected with an emitter wiring 16C.

In the bipolar transistor of vertical structure, each of the n type emitter region (n+ type semiconductor region 14), the p type base region (p type semiconductor region 70A) just below and the n type collector region (n+ type semiconductor region 7C) is used as the substantial operation region. Since the current driving performance of the bipolar transistor of vertical structure is restricted by the size of the planar shape of the n type emitter region, the size of the planar shape for each of the p type base region and the n type collector region is determined on the basis of the size of the planar shape of the n type emitter region. Accordingly, the bipolar transistor of vertical structure is basically constituted such that each of the planar shape for the p type base region and the planar shape for the n type collector region is formed each substantially in the identical size or formed by a widening treatment of successively increasing their size at a predetermined size relative to the planar shape of the n type emitter region. Further, since the planar shape of the opening 3 defined at the periphery thereof with the insulator 2 between the collector lead-out region 4B and the base lead-out electrodes 7B and 70B defines the planar shape of n type collector region, it is constituted with a substantially identical size with that of the planar shape of the n type emitter region, or as a substantially similar shape but larger than that.

Then, a method of manufacturing the bipolar transistor of the vertical structure as described above will now be explained referring to FIG. 3 through FIG. 11 (cross sectional views for a portion shown on every manufacturing steps).

At first, the p− type semiconductor substrate 1 comprising single crystal silicon is prepared. The p− type semiconductor substrate 1 usable herein has (100) or (111) crystal phase orientation for the device forming surface, with the amount of deviation from the crystal phase orientation being within ±1°.

Figure 3:
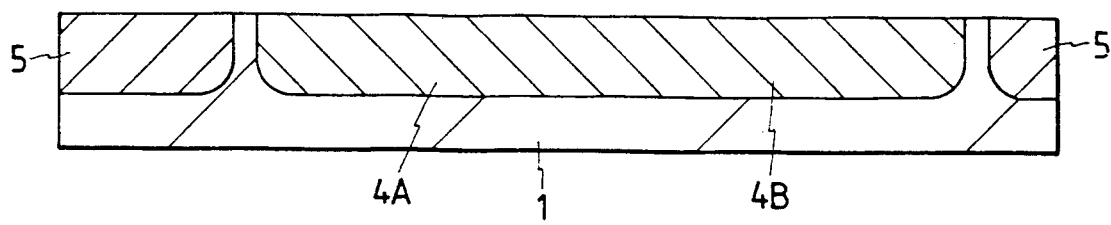
FIG. 3 through FIG. 11 are cross sectional views each for a portion for illustrating the method of manufacturing the bipolar transistor shown in FIG. 1.

Then, as shown in FIG. 3, n type impurities are introduced into the main surface of the active region (a region forming the n type collector region 4A) and the region for forming the collector lead-out region 4B of the p⁻ type semiconductor substrate 1. Subsequently, p type impurities are introduced to the main surface of the inactive region of the p⁻ type semiconductor substrate 1. Each of the n type impurities and the p type impurities is selectively implanted by using, for example, an impurity introduction mask formed through photolithography (for example, photoresist film).

Then, extending diffusion is applied to each of the n type and p type impurities, to form the n+ type semiconductor region 4A and the collector lead-out region 4B with the n type impurities, while form the p+ type semiconductor region 4G (channel stopper) with the p type impurities.

Figure 4:
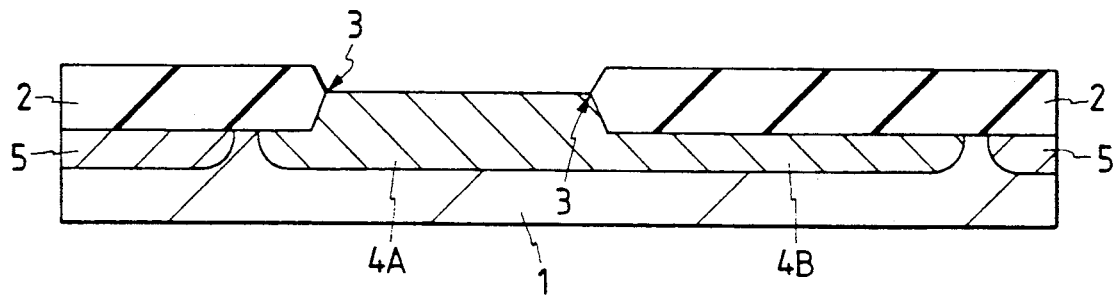

Then, as shown in FIG. 4, an insulator 2 is formed as a device isolation insulation film (field insulation film) on the collector lead-out region 4B and on the p+ type semiconductor 4G of the p⁻ type semiconductor substrate 1. The insulator 2 is formed, for example, by thermal oxidation to a film thickness of about 1.0 μm. In the step of forming the insulator 2, an opening 3 defined at the periphery thereof with the insulator 2 is formed. Within the opening 3, the active region of the p⁻ type semiconductor substrate 1, that is, the main surface of the n+ type semiconductor region 4A is exposed.

Figure 5:
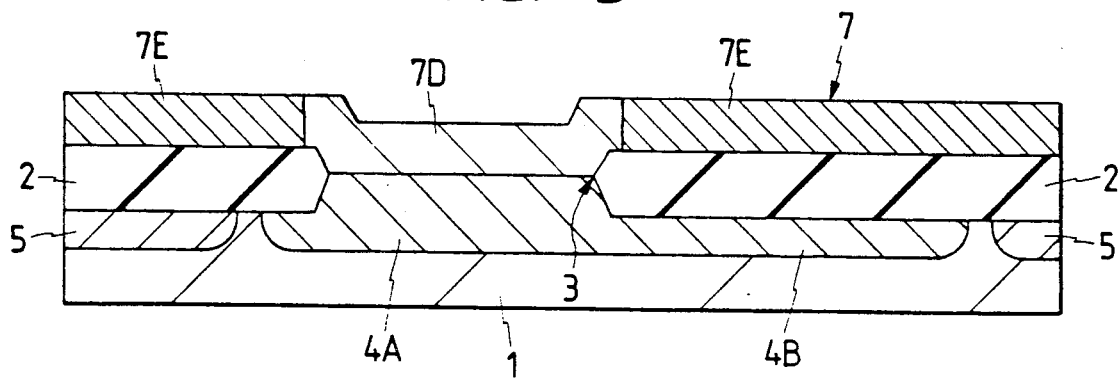

Then, as shown in FIG. 5, a silicon film 7 is formed over the entire surface of the substrate including on the n+ type semiconductor region 4A disposed on the main surface of the p⁻ type semiconductor substrate 1 and on the insulator 2 as the inactive region. The silicon film 7 is deposited, for example, by a CVD process using monosilane (SiH₄) gas as a source gas. With this CVD process, the SiH₄ gas is decomposed at a high temperature of about 1000° C. to deposit silicon corresponding to the crystallinity of the underlying material. That is, the silicon film 7 to be deposited on the n+ type semiconductor region 4A in the active region is deposited as a monocrystalline silicon film 7D since the n+ type semiconductor region 4A is formed with single crystals (epitaxially grown). The silicon film 7 to be deposited on the insulator 2 in the inactive region is deposited as a polycrystalline silicon film 7E since the insulator 2 has no single crystal property but is amorphous. Since the silicon film 7 is formed as an intrinsic collector region in the active region, the silicon film 7 is formed basically as an n type layer at low impurity concentration (or in a state in which none of the n type or p type impurities is introduced, that is, in an intrinsic condition). Further, since a base lead-out electrode 7B introduced with p type impurities at high impurity concentration is to be formed in the subsequent step to the silicon film 7, the silicon film is formed at a low impurity concentration with an aim of reducing the parasitic capacitance formed to the pn junction between the base lead-out electrode and the intrinsic collector region. The n type impurities are introduced into the silicon film 7 by ion implantation or thermal diffusion during or after the deposition of the silicon film 7. The technique of selectively depositing the monocrystalline silicon film 7D corresponding to the crystalline property of the underlying layer and, at the same time, selectively depositing the polycrystalline silicon film 7E corresponding to the crystalline property of the underlying layer is referred to as a SSPD (Simultaneous Single and Poly Si Deposition) method. The silicon film 7 is formed, for example, to a thickness of about 1.0 μm.

Figure 6:
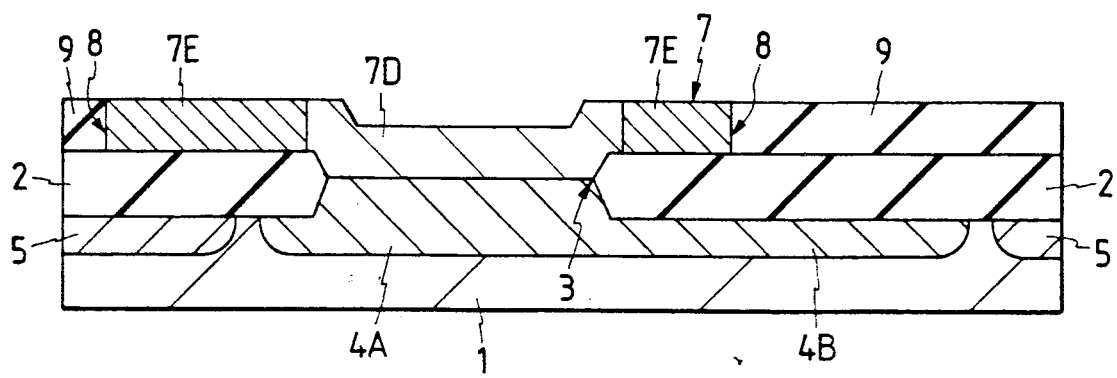

Then, as shown in FIG. 6, the periphery of the base lead-out electrode 7B is defined by patterning the silicon film 7. By the patterning, a groove 8 is formed. The groove 8 is formed by forming an etching mask (for example, photoresist film) by photolithography and etching to eliminate the periphery of the base lead-out electrode of the silicon film 7 by using the etching mask. The etching is applied, for example, by anisotropic etching such as dry etching. In this embodiment, the groove 8 is formed by using the insulator 2 as an etching stopper film and the depth of the groove 8 is substantially defined with the surface of the insulator 2.

Then, a burying insulator 9 is formed in the groove 8. For forming the burying insulator 9, an silicon oxide film is at first deposited to the entire surface of the substrate by means of a CVD process till the inside of the groove 8 is filled. Subsequently, after applying flattening treatment such as by resist coating on the silicon oxide film, the silicon oxide film was etched by an amount corresponding to the thickness deposited on the silicon film 7 by anisotropic etching such as RIE, by which the silicon oxide film can be left only in the groove 8 and the burying insulator 9 is formed with the silicon oxide film.

Figure 7:
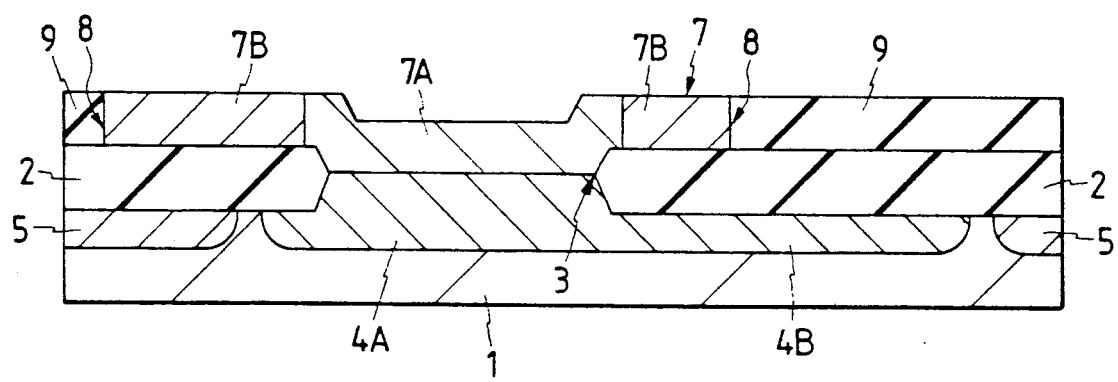

Then, p type impurities are introduced at a high impurity concentration to the polycrystal silicon film 7E of the silicon film 7 (region for forming the base lead-out electrode 7B) as shown in FIG. 7. The p type impurities are introduced into the polycrystalline silicon film 7E by grain boundary diffusion and the diffusion speed is greater as compared with that in the monocrystalline silicon film 7B. That is, the p type impurities can be diffused sufficiently into the base lead-out electrode 7B (polycrystalline silicon film 7E) even if the thickness is large and the resistance value can be decreased. By the same preparation step as the step for forming the base lead-out electrode 7B, an n type semiconductor region (intrinsic collector region) 7A is formed, which is defined at the periphery thereof with the base lead-out electrode 7B. The p type impurities are introduced by using, for example, an impurity introduction mask (for example, photoresist film) formed by photolithography and by way of ion implantation or thermal diffusion. Further, the n type semiconductor region 7A may also be formed by introducing n type impurities to the active region of the silicon film 7 after the deposition of the silicon film 7 and before and after the introduction of the p type impurities that form the base lead-out electrode 7B.

Figure 8:
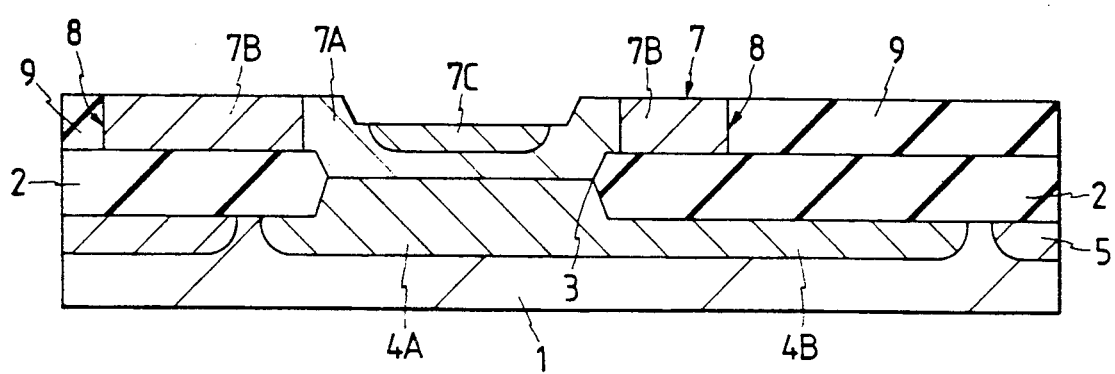

Then, as shown in FIG. 8, an n+ type semiconductor region (collector pedestal region) 7C is formed to the main surface of the n type semiconductor region 7A of the silicon film 7 in the active region. The n+ type semiconductor region 7C is formed by introducing n type impurities by ion implantation to the main surface of the semiconductor region 7A. The n type impurities are introduced by using, for example, an impurity introduction mask (for example, photoresist film) formed by photolithography. Since the n type impurities are introduced to the shallow region from the main surface of the n type semiconductor region 4A, the impurities can be introduced at a low energy dose. Accordingly, crystal defects are scarcely formed in the silicon film 7, that is, for each of the portions of the n type semiconductor region 7A and the n+ type semiconductor region 7C due to the introduction of the n type impurities. Further, knock-on phenomenon is scarcely formed due to the introduction of the n type impurities. Further, since the n type impurities are introduced to the shallow region from the surface of the silicon film 7, and the profile of the impurity concentration of the n+ type semiconductor region 7C is not broad, high controllability is obtained for the profile of the impurity concentration.

It is preferred that the n+ type semiconductor region 7C is formed only in the substantial operation region, so as to minimize the parasitic capacitance formed to the pn junction relative to the p type base region (p type semiconductor region 70A) formed in the subsequent step and the base lead-out electrode 7B. That is, upon forming the n+ type semiconductor region 7C, an impurity introduction mask having an identical planar shape with the n type emitter region (n+ type semiconductor region 14) to be described later is used.

Figure 9:
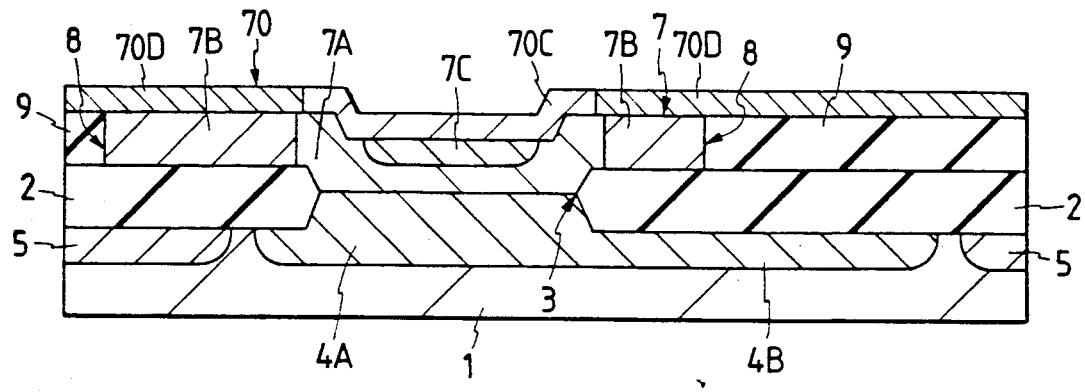

Then, as shown in FIG. 9, a silicon film 70 is formed over the entire surface of the substrate including over the n+ type semiconductor region 7C, the n type semiconductor region 7A and the base lead-out electrode 7B. That is, the silicon film 70 is formed on the silicon film 7. The silicon film 70 is deposited by the CVD process using SiH$_4$ gas as the source gas like that in the silicon film 7. These portions of the silicon film 70 on the n+ type semiconductor region 7C and the n type semiconductor type 7A are formed as a monocrystalline silicon film 70C, since the underlying n+ type semiconductor region 7C and the n type semiconductor region 7A are monocrystalline. The portion of the silicon film 70 on the base lead-out electrode 7B is formed as a polycrystalline silicon film 70D since the underlying base lead-out electrode 7B is polycrystalline.

In the active region, the silicon film 70 is in directly contact with the n type collector regions 7A, 7B and formed to such a thickness as defining the depth of a p type base region 70A to be formed subsequently. That is, the silicon film 70 substantially defines the depth of the p type base region and the depth of the collector region. The silicon film 70 is formed to a thickness, for example, of 0.1 to 0.2 μm.

Figure 10:
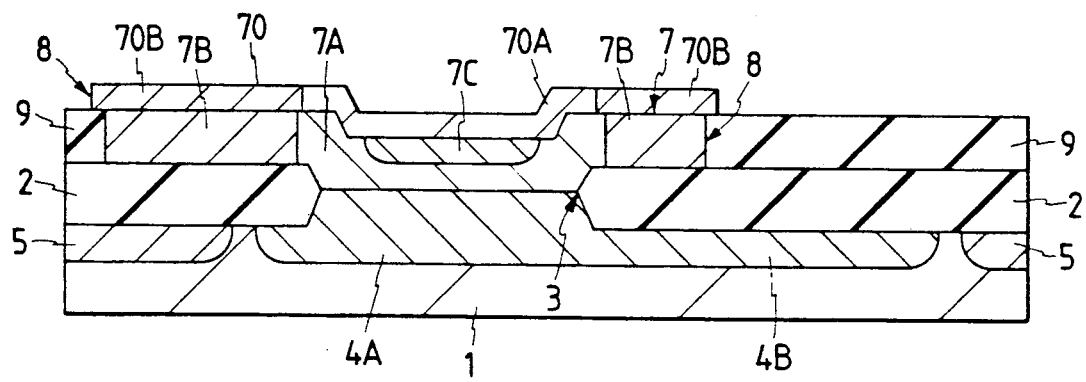

Then, as shown in FIG. 10, p type impurities are introduced at a high impurity concentration to the polycrystal silicon film 7D of the silicon film 70 to form a base lead-out electrode 70B. The p type impurities are introduced, for example, by using boron and by means of ion implantation or thermal oxidation. Upon introducing the p type impurities, an impurity introduction mask is formed on the monocrystalline silicon film 70C of the silicon film 70. The impurity introduction mask is formed, for example, by a photoresist film formed by photolithography. The p type impurities are introduced into the polycrystalline silicon film 70D by grain boundary diffusion like that in the p type impurities introduced into the polycrystalline silicon film 7E of the silicon film 7 and the diffusion rate is greater as compared with that in the monocrystalline silicon film 70C. The base lead-out electrodes 7B and 70B of the two layer structure are substantially completed by the step of forming the base lead-out electrode 70B.

Then, p type impurities are introduced to the silicon layer 70 at least in the active region to form a p type semiconductor region 70A which is a p type base region. The p type semiconductor region 70A is formed by introducing p type impurities by means of ion implantation or thermal diffusion like that in the base lead-out electrode 70B. Since the depth of the pn junction between the p type semiconductor region 70A and the n type collector region (in particular, n− type semiconductor region 7C) is defined by the film thickness of the silicon film 70 as described above, it can be formed shallow. Further, the p type impurities for forming the p type semiconductor region 70A may be introduced also during the deposition of the silicon film 70 or after the deposition of the silicon film 70 and before the introduction of the p type impurities for forming the base lead-out electrode 70B.

Then, patterning is applied to the silicon film 70 to eliminate the region at the periphery of the base lead-out electrode 70 thereby defining the planar shape of the base lead-out electrode 70B. The base lead-out electrode 70B is patterned by anisotropic etching for example, dry etching. The planar shape of the base lead-out electrode 70B is made greater as compared with the planar shape of the underlying base lead-out electrode 7B, at least by the extent corresponding to the amount of the mask alignment in the production step. That is, the planar shape of the base lead-out electrode 70B is formed greater, so that the base lead-out electrode 70 situated below is not etched upon etching the base electrode 70B.

Figure 11:
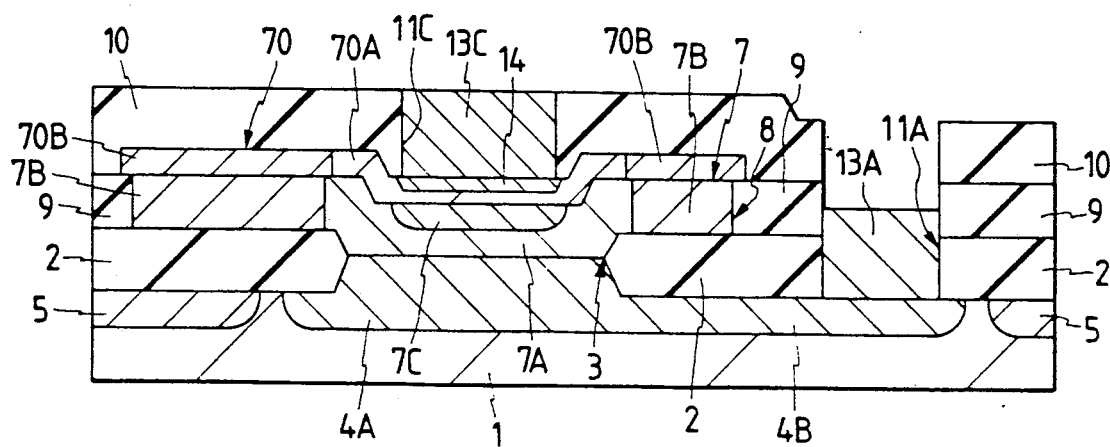

Then, as shown in FIG. 11, an insulation film 10 is formed over the entire surface of the substrate including on the p type semiconductor region 70A, on the base lead-out electrode 70B and on the burying insulator 9. The insulation film 10 is formed with a silicon oxide film deposited, for example, by a CVD process.

Then, each of the insulation film 10, and the insulators 9 and 2 is removed on the other end of the collector lead-out region 4B to form a collector opening 11A through which the surface of the collector lead-out region 4B is exposed. The collector opening 11A is formed by applying anisotropic etching using an etching mask (for example, photoresist film) formed by photolithography.

Then, in the region for forming the n type emitter region, the insulation film 10 is eliminated to form an emitter opening 11C for exposing the surface of the p type semiconductor region 70A. The emitter opening 11B is formed by anisotropic etching like that in the collector opening 11A. Further, the emitter opening 11C may be formed in one identical step for forming the collector opening 11A.

Then, a silicon film is selectively grown by the selective silicon growing method only on the collector lead-out electrode 4B exposed in the collector opening 11A and on the p type semiconductor region 70A exposed in the emitter opening 11B respectively. The silicon film grown on the collector lead-out electrode 4B is monocrystalline since the collector lead-out electrode 4B monocrystalline. In the same way, the silicon film grown on the p type semiconductor region 70A is monocrystalline since the p type semiconductor region 70A is monocrystalline.

Then, n type impurities are introduced to the silicon film grown in each of the collector opening 11A and the emitter opening 11C, to form the collector lead-out electrode 13A in the collector opening 11A and an emitter lead-out electrode 13C in the emitter opening 11C. Further, in the same production step as in the above-mentioned step, the n type impurities introduced into the emitter lead-out electrode 13C are put to drive-in diffusion to the main surface of the semiconductor region 70A to form an n+ type semiconductor region 14 which is an n type emitter region. Alternatively, after depositing the silicon film by the selective silicon growing method, the n type impurities may be doped simultaneously in the silicon film.

Further, each of the collector lead-out electrode 13A and the emitter lead-out electrode 13C may also be formed by depositing a silicon film by means of a CVD process till each of the insides of the collector opening 11A and the emitter opening 11C is filled and, subsequently, removing the silicon film to a thickness corresponding to the deposited film thickness by means of anisotropic etching.

Then, as shown in FIG. 1, a base opening 11A is formed to the insulation film 10 on the base lead-out electrode 70B. The base opening 11B is formed by, for example, anisotropic etching.

Then, as shown in FIGS. 1 and 2, wirings 16A, 16C, 16B connected with the collector lead-out electrode 13A, emitter lead-out electrode 13C and base lead-out electrode 70B respectively are formed.

Then, a bipolar transistor of vertical structure is completed by forming final protection film such as a silicon oxide film, silicon nitride film or PSG film, or a plurality of wiring layers as the upper layers for the wirings 16A, 16C and 16B and forming the final protection film to the upper layer of the wirings.

In the present invention, boron nitride films (BN) with lower dielectric constant as compared with the silicon nitride film can be used for each of the insulators 2 and 9.

Further, in the present invention, the collector lead-out region 4B can be disposed to a portion at the periphery of the n+ type semiconductor region 4A which is the n type collector region. In the same way, in the present invention, the base lead-out electrodes 7B and 70B can be disposed to a portion at the periphery of the p type semiconductor region 70A which is the p type base region.

As described above, in a semiconductor integrated circuit device having a bipolar transistor in which the base lead-out electrode is connected at least to a periphery portion of the p type base region according to the first embodiment of the present invention, the silicon film (first silicon film) 7 and the silicon film (second silicon film) 70 are successively formed, to the active region and the inactive region on the p− type semiconductor substrate (substrate) 1 to form a dual layered silicon film in which the p type base region (p type semiconductor region 70A) is formed to the active region of the upper silicon film 70, while the base lead-out electrodes 7B and 70B are formed in the inactive region for each of the silicon film 7 and the silicon film 70. With such a formation, since the junction depth of the p type base region (p type semiconductor region 70A) can be defined with the thickness of the silicon film 70 among the dual layered silicon film thereby making the junction depth shallow and improving the transportation efficiency of carriers between the n type emitter region (n+ type semiconductor region 14) and the n type collector region (n+ type semiconductor region 7C), it is possible to improve the cut-off frequency ($f_r$) of the bipolar transistor and increase the operation speed of the semiconductor integrated circuit device. Further, since the thickness of the base lead-out electrodes 7B and 70B is defined with the silicon film 7 and the silicon film 70 of the dual layered silicon film by which the film thickness can be increased thereby decreasing the resistance value of the base lead-out electrodes 7B and 70B and decreasing the serial resistance ($r_{BB'}$) of the base current path, it is possible to increase the operation speed of the bipolar transistor and increase the operation speed of the semiconductor integrated circuit device.

Further, in the semiconductor integrated circuit device comprising a bipolar transistor in which the n type collector region, the p type base region and the n type emitter region are formed in the active region on the p− type semiconductor substrate 1, and the base lead-out electrode connected to the periphery of the p type base region is disposed in the inactive region on the p+ type semiconductor substrate 1, a dual layered silicon films is formed over the active region and over the inactive region on the p− type semiconductor substrate 1 by forming each of the silicon film 7 and the silicon film 70 respectively, and a bipolar transistor is formed by disposing the n type emitter region (n+ type semiconductor region 14), the p type base region (p type semiconductor region 70A) and the n type collector region (n+ type semiconductor region 7C and the n type semiconductor region 7Ae to the silicon film 7 and the silicon film 70 in the active region of the dual layered silicon film, while the base lead-out electrodes 7B and 70B are formed to the silicon film 7 and the silicon film 70 in the inactive region of the dual layered silicon films. With such a structure, a higher operation speed can be obtained in the same manner as described above.

Further, in a semiconductor integrated circuit device having a bipolar transistor of vertical structure in which the n type collector region, the p type base region and the n type emitter region are formed respectively in the active region on the p− type semiconductor substrate 1 from the side of the surface of the p− type semiconductor substrate 1, a dual layered silicon films is constituted by successively forming each of the silicon film 7 and the silicon film 70 in the active region of the p− type semiconductor substrate 1, the n type semiconductor region 7A which is an intrinsic collector region is formed in the silicon film 7 of the dual layered silicon film, each of the p type base region (p type semiconductor region 70A) and the n type emitter region (n+ type semiconductor region 14) is formed successively from the side of the silicon film 7 to the silicon film 70, and the n+ type semiconductor region (collector pedestal region) 7C of the conduction type identical with that of the n type semiconductor region 7A and at a higher impurity concentration as compared with the n type semiconductor region 7A is formed to the main surface of the n type semiconductor region 7A formed with the silicon film 7 on the side of the silicon film 70. With such a constitution, since the junction depth of the p type base region is defined by the thickness of the silicon film 70 of the dual layered silicon film by which the junction depth thereof can be made shallow and the transportation efficiency of the carriers between the n type emitter region and the n type collector region can be improved, it is possible to improve the cut-off frequency ($f_T$) of the bipolar transistor of vertical structure and increase the operation speed of the semiconductor integrated circuit device. Further, since the profile for the impurity concentration in the pn junction between the p type base region and the n+ type semiconductor region 7C can be made steep thereby increasing the intensity of the electric field in the pn junction (making the slope of the impurity concentration steep), the running time of the carrier between the n type emitter region and the n type collector region can be shortened to increase the operation speed of the bipolar transistor of vertical structure and increase the operation speed of the semiconductor integrated circuit device. Further, since the resistance for a portion of the collector current path in the n type collector region can be decreased by means of the n+ type semiconductor region 7C and the running time of the carriers can be shortened, it is possible to increase the operation speed of the bipolar transistor of vertical structure and increase the operation speed of the semiconductor integrated circuit device.

Further, the planar shape of the n+ type semiconductor region 7C is made substantially identical in the size with the planar shape of the n type emitter region (n+ type semiconductor region 14). With such a formation, since the parasitic capacitance ($C_{TC}$) formed in the pn junction between the n+ semiconductor region 7C and the p type base region (p type semiconductor region 7A) can be minimized, it is possible to increase the operation speed of the bipolar transistor of vertical structure and increase the operation speed of the semiconductor integrated circuit device.

Further, the method of manufacturing a semiconductor integrated circuit device having a bipolar transistor of vertical structure in which the n type collector region, p type base region and n type emitter region are respectively arranged in the active region on the p⁻ type semiconductor substrate 1 successively from the side of the surface of the p⁻ type semiconductor substrate 1, comprises a step of forming the silicon film 7 in the active region on the p⁻ type semiconductor substrate 1 and forming the n type semiconductor region (intrinsic collector region) 7A in the silicon film 7, a step of introducing n type impurities of the conduction type identical with that of the n type semiconductor region 7A to the main surface of the n type semiconductor region 7A by means of ion implantation, thereby forming the n+ type semiconductor region (collector pedestal region) 7C at a higher impurity concentration as compared with the n type semiconductor region 7A, and a step of forming the silicon film 70 on the silicon film 7 and then forming each of the p type base region (p type semiconductor region 70A) and the n type emitter region (n+ type semiconductor region 14) respectively to the silicon film 70 successively from the side of the silicon film 7. With the constitution as described above, since the n type collector region can be formed to the silicon film 7, while the p type base region and the n type emitter region can be formed respectively to the silicon film 70, and the n type impurities for forming the n+ type semiconductor region 7A can be introduced into the shallow region in the n type semiconductor region (intrinsic collector region) 7A of the silicon film 7, the amount of energy required for the introduction of the n type impurities can be reduced. As a result, the amount of crystal defects or knock-on phenomenon in the silicon film 7 due to the introduction of the n type impurities can be reduced to improve the production yield of the semiconductor integrated circuit device. Further, since the amount of the energy required for the introduction of the n type impurities is reduced and the n type impurities are introduced to the shallow region at the surface of the silicon film 7, it is possible to improve the controllability for the profile of the impurity concentration in the n+ type semiconductor region 7C. Furthermore, since the n+ type semiconductor region 7C can reduce the amount of the crystal defects formed due to the introduction of the n type impurities and improve the controllability for the profile of the impurity concentration, it is possible to increase the impurity concentration and decrease the resistance value of the collector current path.

Further, in a semiconductor integrated circuit device having a bipolar transistor of vertical structure in which the n type collector region, the p type base region and n type emitter region are respectively arranged in the active region on the p⁻ type semiconductor substrate 1 successively from the side of the surface of the p⁻ type semiconductor substrate 1, and the base lead-out electrode connected at least to a portion at the periphery of the p type base region is formed in the inactive region on the p⁻ type semiconductor substrate 1, the dual layered silicon films is formed by successively forming each of the silicon film 7 and the silicon film 70 in the active region and in the inactive region of the p⁻ type semiconductor substrate 1, the n+ semiconductor region (intrinsic collector region) 7A is formed in the active region of the silicon film 7 of the dual layered silicon film, each of the p type base region and the n type emitter region is formed successively in the active region of the silicon film 70 successively from the side of the silicon film 7, the n+ type semiconductor region (collector pedestal region) 7C of the conduction type identical with that of the n+ type semiconductor region 7A and at a higher impurity concentration as compared with the n type semiconductor region 7A is formed to the main surface of the n type semiconductor region 7A formed to the silicon film 7 on the side of the silicon film 70, and the base lead-out electrodes 7B and 70B are formed to the respective inactive regions of the silicon film 7 and the silicon film 70. With such a formation, it is possible to obtain a bipolar transistor with a lower base resistance ($r_{bb}'$), a lower collector resistance and of a higher operation speed.

SECOND EMBODIMENT

The second embodiment of the present invention is similar to the first embodiment except for replacing the bipolar transistor of vertical structure in the first embodiment with a hetero junction type bipolar transistor.

Figure 12:
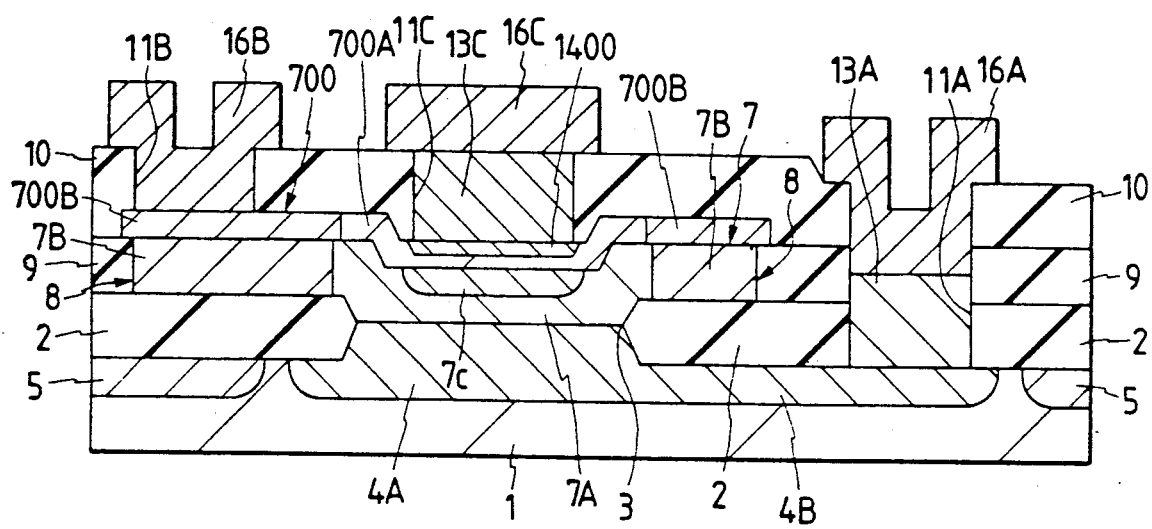
FIG. 12 is a cross sectional view for a portion of a hetero junction bipolar transistor as a second embodiment according to the present invention.

As shown in FIG. 12, this embodiment is different from the bipolar transistor of the first embodiment in that the silicon film 70 constituting the active region of the bipolar transistor of vertical structure and the lead-out electrodes in the first embodiment is formed with a silicon-germanium compound film (Si-Ge) 700. That is, a p type base region 700A (corresponding to the p type semiconductor region 70A of the first embodiment), an n type emitter region 1400 (corresponding to the n+ type semiconductor region 14 of the first embodiment) and base lead-out electrode 700B (corresponding to 70B of the first embodiment) of the bipolar transistor of vertical structure are formed with a compound film 700 comprising Si-Ge. In this case, the band gap $E_g$(Si-Ge) of the Si-Ge compound 700 is preferably set to about 0.9 (eV) or less, because the band gap $E_g$(Si) of the silicon film 7 from which the n type collector regions 7A and 7C are formed is about 1.2 (eV) and, therefore; the band gap difference $\Delta E_g(E_G(\text{Si-Ge}) - E_G(\text{Si}))$ between both of them is set to about $-0.2$ (eV) or greater. Theoretically, if the band gap difference $\Delta E_g$ is negative, a merit of a hetero junction bipolar transistor can be obtained. In the bipolar transistor of vertical structure, the boundary between the bottom of the p type base region 700A and the n type collector region 7A (surface of the silicon film 7) is mainly composed of a hetero junction.

In this way, the operation region of the bipolar transistor of vertical structure is constituted with a dual layered conductor film and, among the a dual layered conductor film, the upper conductor film 70 is formed with the Si-Ge compound film 700. With this constitution, in the bipolar transistor of the second embodiment, since the barrier of the energy value at the hetero junction becomes higher to electrons than to holes as compared with the case of homogeneous junction and the impurity concentration of the p type base region (p type semiconductor region 70A) can be increased, the serial resistance of the base current path can be decreased further, thereby enabling to increase the operation speed of the bipolar transistor of vertical structure and increase the operation speed of the semiconductor integrated circuit device. On the contrary, since the impurity concentration of the n type collector regions 7A and 7C of the bipolar transistor of vertical structure can be set lower, by which the parasitic capacitance formed between the n type collector region and the p type base region can be reduced and the parasitic capacitance added to each of the n type collector region and the p type base region can be reduced, it is possible to increase the operation speed of the bipolar transistor of vertical structure and increase the operation speed of the semiconductor integrated circuit device.

THIRD EMBODIMENT

The third embodiment of the present invention has a feature in that the collector region and the collector lead-out region are formed in one identical silicon film in a bipolar transistor of vertical structure.

The constitution of the bipolar transistor as the third embodiment according to the present invention will now be explained referring to FIG. 13 (cross sectional view) and FIG. 14 (plan view).

Figure 13:
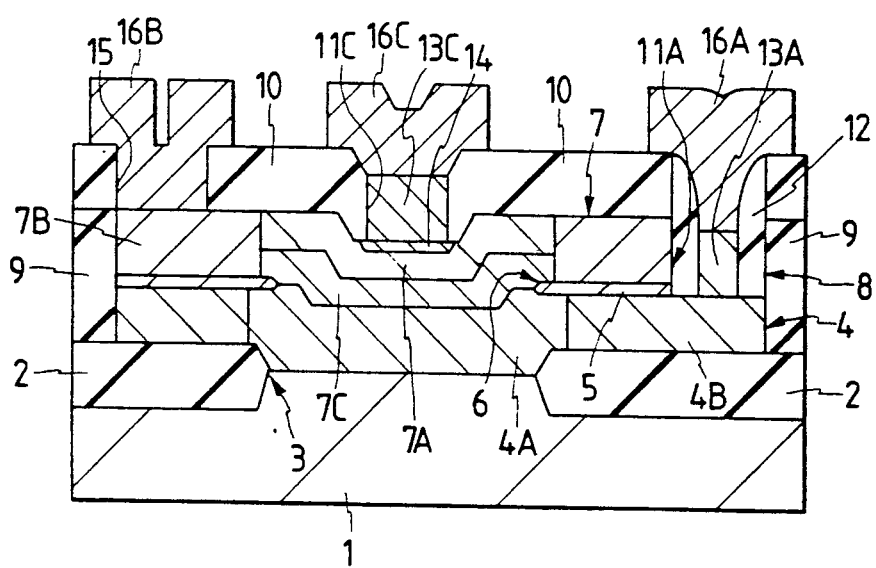
FIG. 13 is a cross sectional view for a portion of a bipolar transistor as a third embodiment according to the present invention.
Figure 14:
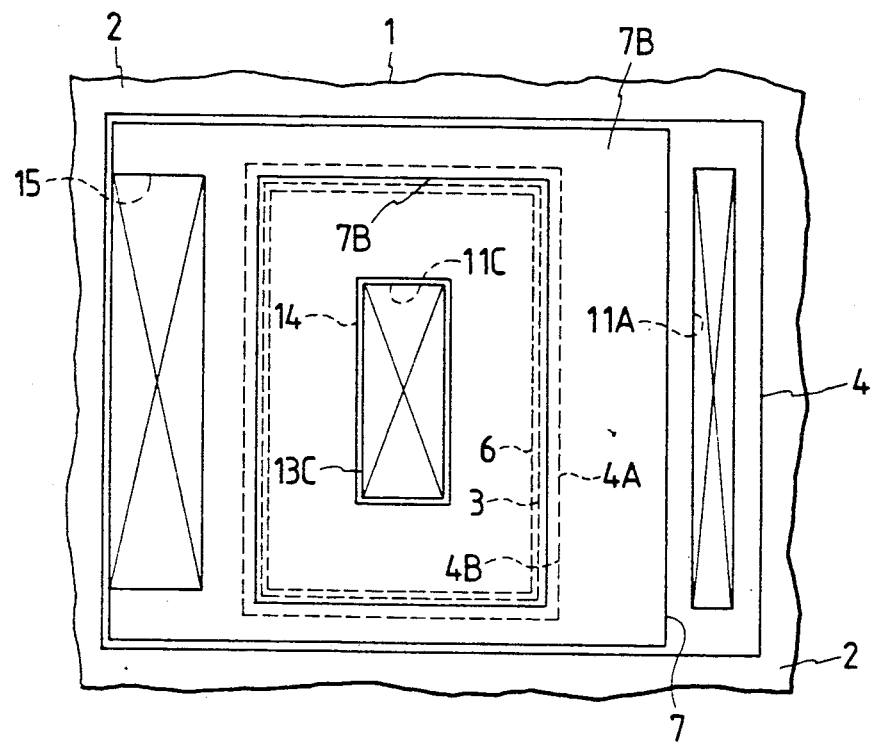
FIG. 14 is a plan view for a portion corresponding to the bipolar transistor shown in FIG. 13.

As shown in FIGS. 13 and 14, the bipolar transistor is formed on a p⁻ type semiconductor substrate 1 made of a monocrystalline. Within a region surrounded at the periphery thereof with a device isolation region, a bipolar transistor of vertical structure is formed in an active region of the p⁻ type semiconductor substrate 1. The bipolar transistor of vertical structure comprises an n type collector region, a p type base region and an n type emitter region. Each of the n type collector region, the p type base region and the n type collector region is successively arranged from the main surface of the p⁻ type semiconductor substrate 1 in the vertical direction.

The device isolation region mainly comprises the p⁻ type semiconductor substrate 1, an insulator (field insulation film) 2, a groove 8, and a burying insulator 9. The p⁻ type semiconductor substrate 1 is applied with the lowest potential, for example, $-V_{EE}$ (for example, $-5.4$ (V)) among the potentials used for the semiconductor integrated circuit device, while the n⁺ type semiconductor region 4A is applied, for example, with a ground potential (for example, 0 (V)). The p⁻ type semiconductor substrate 1 and the lower portion of the bipolar transistor of vertical structure, that is, the n type collector region 4A constitute a pn junction, and they are electrically isolated from each other. The insulator 2 serves to electrically separate the collector lead-out region 4B described later and the p⁻ type semiconductor substrate 1. The groove 8 and the burying insulator 9 surround the periphery of the collector lead-out region and the base lead-out region 7B to be described later, thereby electrically isolating the collector lead-out region and the base lead-out region from other regions.

The n⁺ collector region of the bipolar transistor of vertical structure comprises an n⁻ type semiconductor region 4A corresponding to the n⁻ type buried layer and an n⁺ type semiconductor region (intrinsic collector region) 7C. The n⁺ type semiconductor region 4A is formed in the silicon film 4 disposed in the active region of the p⁻ type semiconductor substrate 1. The n⁺ type semiconductor region 4A (active region of the silicon film 4) is composed of single crystals and the lower surface thereof is brought into direct contact with the surface of the p⁻ type semiconductor substrate 1. Physical connection in each of the n⁺ type semiconductor region 4A and the p⁻ type semiconductor substrate 1 is conducted within an opening 3 the periphery of which is defined with the insulator 2 disposed on the inactive region of the p⁻ type semiconductor substrate 1. The opening 3 is used as a heat dissipating path for dissipating the heat generated upon operation of the bipolar transistor of vertical structure to the p⁻ type semiconductor substrate 1. An n type semiconductor region 7C is formed in the lower portion of a silicon film 7 disposed on the n⁺ type semiconductor region 4A which is the collector region. The n type semiconductor region 7C (active region of the silicon film 7) is composed of single crystals and the lower surface thereof is in direct contact with the n⁺ type semiconductor region 4A. The connection for each of the n type semiconductor region 7C and the n⁺ type semiconductor region 4A is made within an opening 6 the periphery of which is defined with an insulator 5 disposed on the collector lead-out region (semiconductor region) 4B.

The collector lead-out region 4B is formed at the periphery of the n⁺ type semiconductor region 4A which is the n type collector region being electrically connected at one end thereof to the side of the n⁺ type semiconductor region 4A. The collector lead-out region 4B is formed with the silicon film 4 which is an identical layer with that of the n⁺ type semiconductor region 4A and formed integrally with the n⁺ type semiconductor region 4A. The collector lead-out region 4B is extended on the insulator 2 disposed on the main surface of the p⁻ type semiconductor substrate 1 and formed with the silicon film 4 which is an identical layer with that of the n⁺ type semiconductor region 4A but is polycrystalline. As can be seen from FIGS. 13 and 14, the collector lead-out region 4B is disposed along the periphery of the n⁺ type semiconductor region 4A. The collector lead-out region 4B is connected at the other end thereof to a collector wiring 16A by way of a collector lead-out electrode 13A. A collector potential (for example, 0 (V) ground potential) is supplied from the wiring 16A through each of the lead-out electrode 13A and the region 4B to the collector regions 4A, 7C of the bipolar transistor of vertical structure from the side of the surface of the p⁻ type semiconductor substrate 1.

The collector lead-out electrode 13A is connected through a collector opening 11A formed in each of the insulation film 10 and the silicon film 7 to the collector lead-out region 4B. The collector lead-out electrode 13A is made, for example, of a polycrystalline silicon film, and n type impurities for reducing the resistance value are introduced into the polycrystalline silicon film. The collector lead-out electrode 13A and the silicon film 7 (base lead-out electrode 7B) are electrically separated from each other by an insulator (side wall spacer) 12 formed on the side wall of the collector opening 11A.

The wiring 16A is made, for example, of aluminum or aluminum alloy. The aluminum alloy comprises aluminum and Cu or Cu and Si added thereto.

The p type base region is composed of a p type semiconductor region (intrinsic base region) 7A. The p type semiconductor region 7A is formed on the n type semiconductor region 7C in the n type collector region and is formed in the upper part of the silicon film 7. The p type semiconductor 7A is a monocrystalline and the lower surface thereof is in direct contact with the surface of the n type semiconductor region 7C. That is, the p type semiconductor region 7A is formed with the silicon film 7 which is an identical layer with that of the silicon film 7 for forming the n type semiconductor region 7C.

At the periphery of the p type semiconductor region 7A as the p type base region, a base lead-out electrode 7B is formed, and one end thereof is electrically connected with the side of the p type semiconductor region 7A. The base lead-out electrode 7B is formed with the silicon film 7 which is an identical layer with that of the p type semiconductor region 7A and the n type semiconductor region 7C and formed integrally with the p type semiconductor region 7A. The base lead-out electrode 7B is disposed by way of the insulator 5 disposed on the collector lead-out region 4B, and formed with the silicon film 7 which is an identical layer with that of the p type semiconductor region 7A but is polycrystalline. As shown in FIGS. 13 and 14, the base lead-out electrode 7B is disposed along the entire region for the periphery of the p type semiconductor region 7A. The other end of the base lead-out electrode 7B is connected to a base wiring 16B. Each of the base lead-out electrode 7B and the wiring 16B is connected through a base opening 15 formed in an inter-layer insulation film 10.

The n type emitter region is formed with an n+ type semiconductor region 14. The n+ type semiconductor region 14 is formed to the main surface of the p type semiconductor region 7A which is the p type base region, that is, at the surface of the silicon film 7. The n+ type semiconductor region 14 is formed with single crystals.

An emitter lead-out electrode 13C is connected to the main surface of the n+ type semiconductor region 14 which is the n type emitter region. The emitter lead-out electrode 13C is formed with an identical layer with that of the collector lead-out electrode 13A and it is formed with a monocrystalline silicon film or polycrystalline silicon film, to which n type impurities are introduced with an aim of decreasing the resistance value and for use as a diffusion source for forming the n+ type semiconductor region 14. The emitter lead-out electrode 13C is connected through an emitter opening 11C formed in the insulation film 10 to the main surface of the n+ type semiconductor region 14. The n+ type semiconductor region 14 as the n type emitter region is formed within the region, the periphery of which is defined with the emitter opening 11C, by introducing n type impurities by drive-in diffusion from the emitter lead-out electrode 13C to the main surface of the p type semiconductor region 7A. The emitter lead-out electrode 13C is connected with an emitter wiring 16C.

In the bipolar transistor of vertical structure, each of the n type emitter region (n+ type semiconductor region 14), the p type base region (p type semiconductor region 7A) situated just below and the n type collector region (n type semiconductor region 7C) is used as a substantial operation region. Since the current driving performance of the bipolar transistor of vertical structure is restricted by the size of the planar shape for the n+ emitter region, the size of the planar shape for each of the p type base region and the n type collector region is determined based on the size of the planar shape for the n type emitter region. Accordingly, in the bipolar transistor of vertical structure, each of the planar shape for the p type base region and the planar shape for the n type collector region is, basically, constituted such that their shape is substantially identical size with or increased successively relative to the planar shape for the n type emitter region. Further, the planar shape of the opening 6 the periphery of which is defined with the insulator 5 between the collector lead-out region 4B and the base lead-out electrode 7B is constituted to such a shape that is formed by a treatment of widening with a predetermined size relative to the planar shape for the n type emitter region 14. Similarly, the planar shape of the opening 3 the periphery of which is defined with the insulator 2 between the collector lead-out region 4B and the p− type semiconductor substrate 1 is constituted to such a shape that is formed by a treatment of widening with a predetermined size relative to the planar shape for the n type emitter region. With the same reason as described above, each of the openings 6 and 3 is constituted such that their shape if identical with or increased successively relative to the planar shape for the n type emitter region.

Description will now be made to the method of manufacturing the bipolar transistor of vertical structure with reference to FIGS. 15 through 24 (cross sectional views for a portion illustrating each of the production steps).

At first, a p− type semiconductor substrate 1 comprising monocrystalline silicon is prepared. As the p− type semiconductor substrate 1, a substrate in which the device forming surface has a crystal orientation (100) or (111) and the amount of deviation from the crystal orientation is within ±1° is used.

Then, a silicon oxide film 20 is formed over the entire surface of the p− type semiconductor substrate 1. The silicon oxide film 20 is formed, for example, by thermal oxidation.

Figure 15:
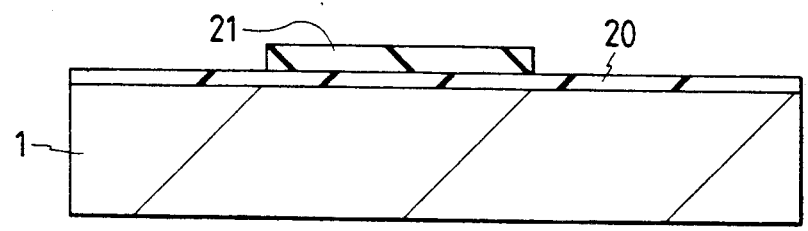
FIG. 15 through FIG. 24 are cross sectional views each for a portion for illustrating the method of manufacturing the bipolar transistor shown in FIG. 13.

Then, as shown in FIG. 15, a mask 21 is formed on the silicon oxide film 20 in the active region (bipolar transistor forming region). Since the mask 21 is used as an oxidation resistant mask, it is formed, for example, with a silicon nitride film deposited by a CVD process.

Then, the silicon oxide film in the inactive region is grown by using the mask 21 to form an insulation film (insulator) 2 as a device isolating insulative film. The insulator 2 is formed, for example, by thermal oxidation to a thickness of about 1.0 ($\mu$m). Then, after removing the mask 21, the silicon oxide film 20 in the active region is removed to expose the surface of the p− type semiconductor substrate 1 by using the insulator 2 as an etching mask. In the step of removing the silicon oxide film 20, an opening 3 the periphery of which is defined with the insulator 2 is formed.

Figure 17:
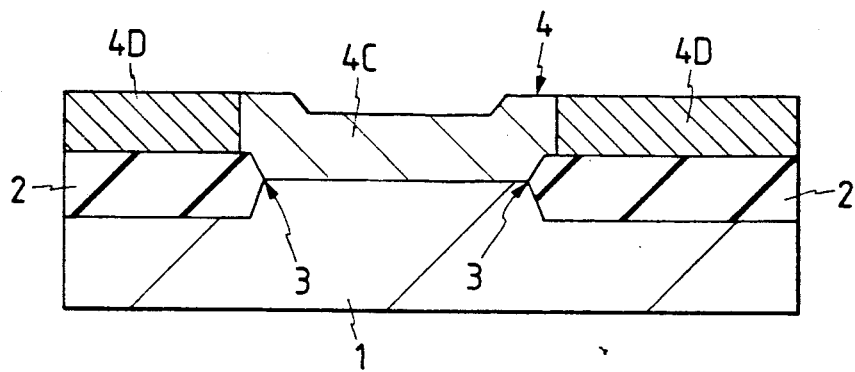

Then, as shown in FIG. 17, a silicon film 4 is formed over the entire surface of the substrate including the p− type semiconductor substrate 1 exposed in the active region and the insulator 2 as the inactive region. The silicon film 4 is deposited, for example, by a CVD process using monosilane ($SiH_4$) gas as a source gas. By the CVD process, $SiH_4$ gas is decomposed at a high temperature of about 1000° C. and silicon is deposited corresponding to the crystallinity of the underlying tissue. That is, since the p− type semiconductor substrate 1 is monocrystalline, the silicon film 4 deposited in the active region on the p− type semiconductor substrate 1 is formed as a monocrystalline silicon film 4C (epitaxially grown). The silicon film 4 deposited on the insulator 2 in the inactive region is deposited as a polycrystalline silicon film 4D since the insulator 2 has no single crystalline property (amorphous). A technique of depositing the monocrystalline silicon film 4C corresponding to the crystallinity of the underlying layer selectively and, at the same time, depositing the polycrystalline silicon film 4D selectively corresponding to the different crystalline nature of the underlying texture in this way is referred to as SSPD (Simultaneously Single and Poly Si Deposition) method. The silicon film 4 is formed, for example, to a thickness of about 1.0 μm.

Figure 18:
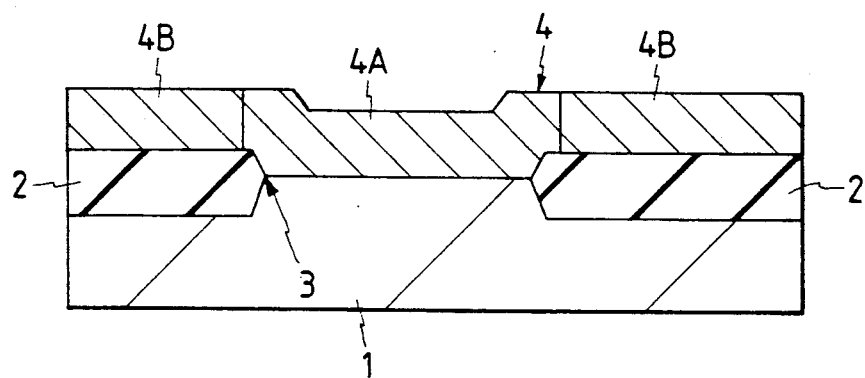

Then, n+ impurities are introduced to each of the monocrystalline silicon film 4C and the polycrystalline silicon film 4D of the silicon film 4. As shown in FIG. 18, an n type semiconductor region 4A is formed with the n type impurities introduced into the monocrystalline silicon film 4C, while a collector lead-out region 4B is formed with the n type impurities introduced into the polycrystalline silicon film 4D. As the n type impurity, there is used, for example, Sb, P or As and the n type impurity is introduced by means of ion implantation or thermal diffusion. Further, the n type impurity to be introduced into the silicon film 4 may be introduced during deposition of the silicon film 4.

Figure 19:
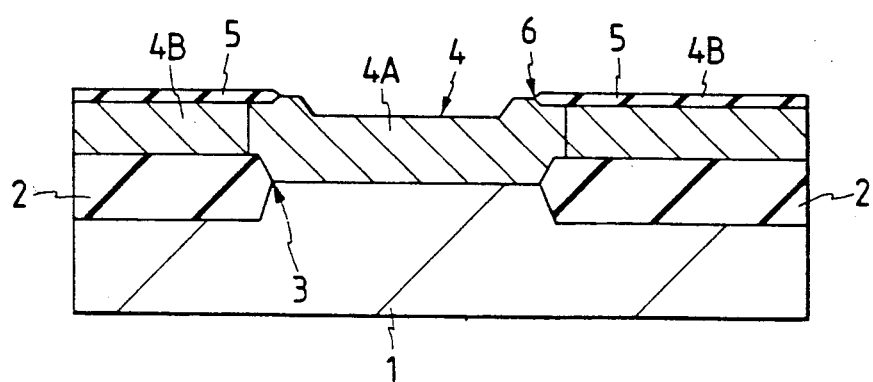

Then, as shown in FIG. 19, an insulator 5 is formed on the collector lead-out region 4B. The insulator 5 is formed with a silicon oxide film formed, for example, by thermally oxidizing the surface of the silicon film 4 selectively to a thickness of about 0.2 μm.

Figure 20:
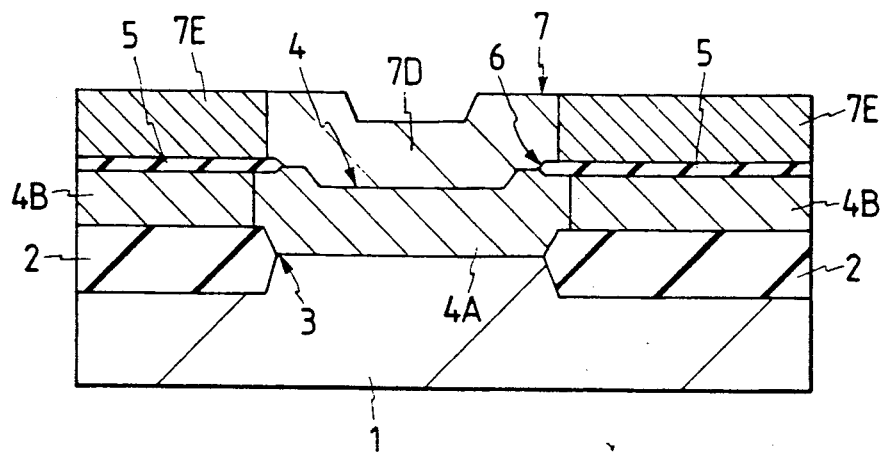

Then, as shown in FIG. 20, a silicon film 7 is deposited on the entire surface of a substrate including over the n+ type semiconductor region 4A and over the insulator 5. The silicon film 7 is deposited by the CVD process using SiH$_4$ gas as a source gas in the same manner as for the silicon film 4. The silicon film 7 is formed as the monocrystalline silicon film 7D on the n+ type semiconductor region 4A since the underlying n+ type semiconductor region 4A is monocrystalline. The silicon film 7 is formed as a polycrystalline silicon film 7E on the insulator 5 since the underlying insulator 5 is in a amorphous state. The silicon film 7 is deposited as n− type in order to form a steep profile for the impurity concentration in the p type base region to be formed in the subsequent step. That is, the silicon film 7 is deposited in a state free from the p type impurity. A n type semiconductor region 7C is formed by forming the silicon film 7.

Figure 21:
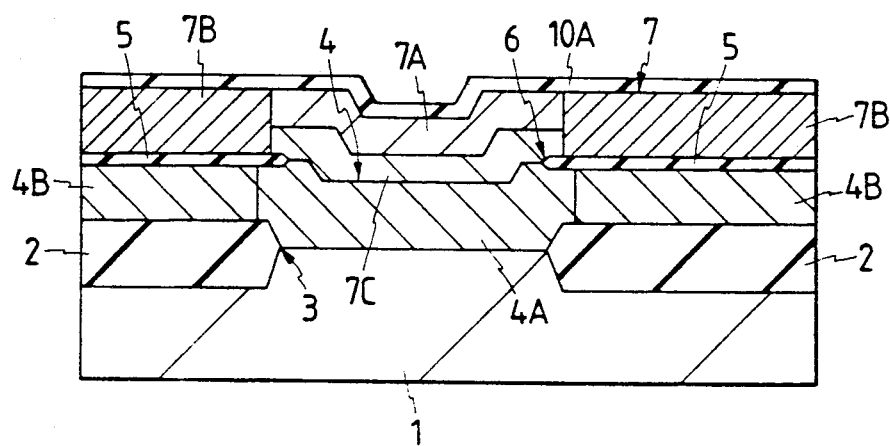

Then, as shown in FIG. 21, a silicon oxide film 10A is formed over the entire surface of the silicon film 7. The silicon oxide film 10A is used as a buffer film for avoiding injury to the crystals in the silicon film 7 and preventing the intrusion of contaminants such as heavy metals to the silicon film 7 upon introducing the impurities.

Then, p type impurities are introduced at a high concentration to the polycrystalline silicon film 7E of the silicon film 7 to form a base lead-out electrode 7B. Boron is used, for example, as the p type impurity and it is introduced through the silicon oxide film 10A by ion implantation into the polycrystalline silicon film 7E. Upon introducing the p type impurity, an impurity introduction mask is formed on the monocrystalline silicon film 7D of the silicon film 7. The impurity introduction mask is formed, for example, with a photoresist film formed, for example, by photolithography. The p type impurities are introduced into the polycrystal silicon film 7E through grain boundary diffusion and the diffusion speed is higher as compared with that in the single crystal silicon film 7D. That is, the p type impurities can be diffused sufficiently to decrease the resistance value of the base lead-out electrode 7B (polycrystalline silicon film 7E) even if the film thickness thereof is large. Further, since the base lead-out electrode 7B is formed on the collector lead-out region 4B by way of the insulator 5 and the insulator 5 constitutes a shielding film to the impurity diffusion p type impurities can be introduced at a high concentration. That is, the resistance value of the base lead-out electrode 7B can be decreased sufficiently. Further, since the insulator 5 is formed between the base lead-out electrode 7B and the collector lead-out region 4B, parasitic capacitance formed between both of them is reduced.

Then, p type impurities are introduced to the surface of the silicon film 7, particularly, to the surface of the single crystalline silicon film 7D to form a p type semiconductor region 7A which is a p type base region. The p type semiconductor region 7A is formed by introducing p type impurities by ion implantation like that in the base lead-out electrode 7B. The pn junction between the p type semiconductor region 7A and the n type collector region (n type semiconductor region 7C) therebelow is formed in the silicon film 7D. That is, the width of the base region of the bipolar transistor is made smaller as compared with the thickness of the base lead-out electrode 7B (thickness of the silicon film 7), for example, to about 0.2–0.5 μm. By forming the p type semiconductor region 7A, an n type semiconductor region 7C the periphery of which is surrounded with the p type semiconductor region 7A and base lead-out electrode 7B is formed (the range for the n type semiconductor region 7C is defined).

Figure 22:
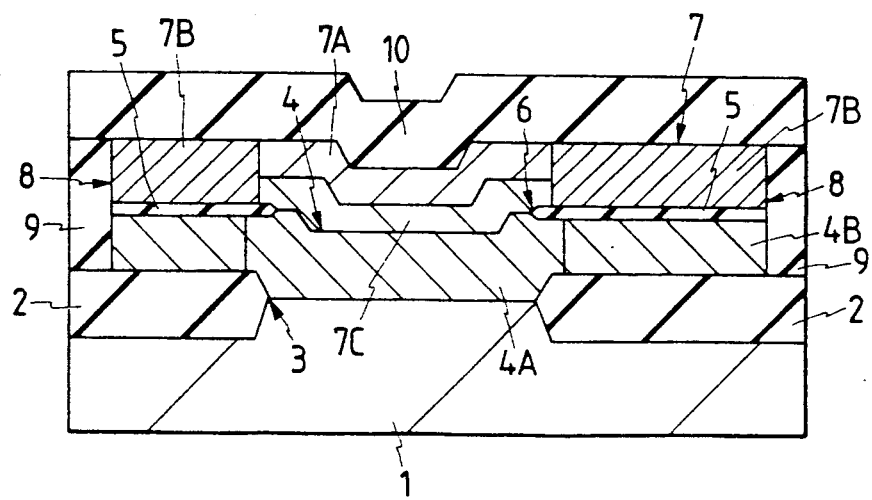

Then, as shown in FIG. 22, a groove 8 is formed in a region for defining the periphery for each of the base lead-out electrode 7B and the collector lead-out region 4B. The groove is formed by, for example, preparing an etching mask (for example, photoresist film) by photolithography and etching to eliminate the periphery for each of the base lead-out electrode 7B and the collector region 4B by using the etching mask. The etching is applied, for example, by anisotropic etching such as dry etching. In this embodiment, the groove 8 is formed by using the insulator 2 as the etching stopper film and the depth of the groove 8 is substantially defined with the surface of the insulator 2. Further, the groove 8 may be formed through the insulator 2 also into the p− type semiconductor substrate 1.

Then, a burying insulator 9 is formed within the groove 9. For forming the burying insulator 9, a silicon oxide film is deposited to the entire surface of the substrate till the inside of the groove 8 is buried, for example, by a CVD process. Subsequently, after applying a flattening treatment such as resist coating on the entire surface of the deposited silicon oxide film, the silicon oxide film can be left only in the groove 8 by successively etching back the resist film and the silicon oxide film by anisotropic etching such as RIE, and the burying insulator 9 is formed with the silicon oxide film. Then, the silicon oxide film 10A is removed.

Subsequently, an insulation film 10 is formed over the entire surface of a substrate including on the p type semiconductor region 7A, on the base lead-out electrode 7B and on the burying insulator 9. The insulation film is formed, for example, with a silicon oxide film deposited by a CVD process.

Figure 23:
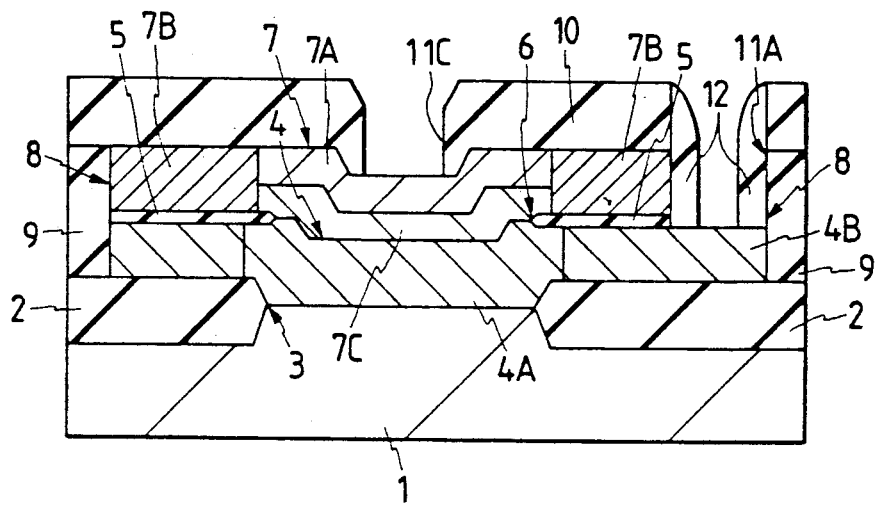

Then, as shown in FIG. 23, each of the insulation film 10, the base electrode 7B and the insulator 5 is removed at the other end of the collector lead-out region 4B, to form a collector opening 11A such that the surface of the collector lead-out region 4B is exposed. The collector opening 11A is formed by applying anisotropic etching by using an etching mask (for example, photoresist film) prepared by photolithography.

Then, an insulator (side wall spacer) 12 is formed to the side wall in the collector opening 11A. The insulator 12 is formed, for example, by depositing a silicon oxide film over the entire surface of the substrate by a CVD process and, subsequently, etching the silicon oxide film by a portion corresponding to the thickness of the film deposited by anisotropic etching such as RIE. The insulator 12 electrically isolates each of the base lead-out electrode 7B and the collector lead-out electrode 13A to be described later from each other.

Then, the insulation film 10 is removed in the region for forming the n type emitter region to form an emitter opening 11 such that the surface of the p type semiconductor region 7A is exposed. The emitter opening 11C is formed in the same manner as the collector opening 11A by means of anisotropic etching. Alternatively, the emitter opening 11C may be formed by an identical production step with the etching step for forming the collector opening 11A.

Figure 24:
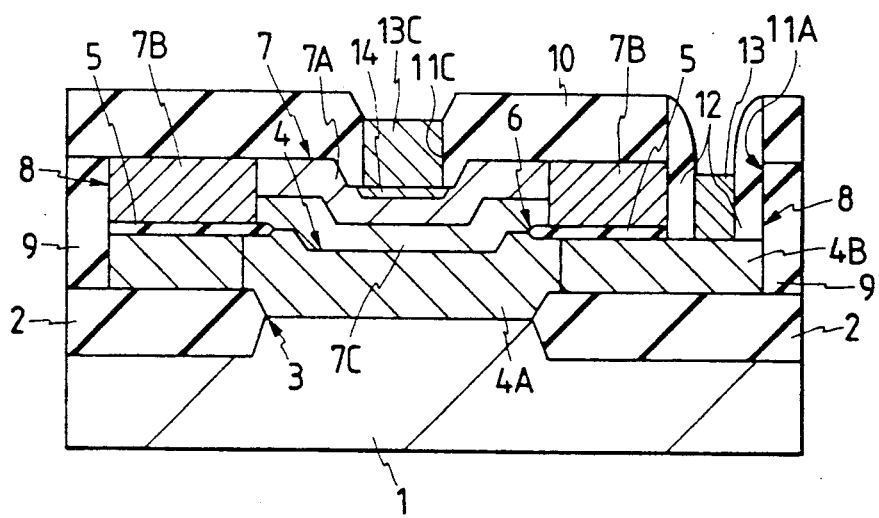

Then, as shown in FIG. 24, a silicon film is grown selectively by a selective silicon film growing method only on each of the collector lead-out region 4B exposed in the collector opening 11A and the p type semiconductor region 7A exposed in the emitter opening 11C. Since the collector lead-out region 4B is polycrystalline, the silicon film grown on the collector lead-out region 4B is is polycrystalline. Since the p type semiconductor region 7A is monocrystalline, the silicon film grown on the p type semiconductor region 7A is crystals.

Then, n type impurities are introduced into the silicon films grown to the inside of the collector opening 11A and the emitter opening 11C respectively to form a collector lead-out electrode 13A in the collector opening 11A, and form an emitter lead-out electrode 13C in the emitter opening 11C. Further, as shown in FIG. 24, the n type impurities introduced into the emitter lead-out electrode 13 are put to drive-in diffusion to the main surface of the p type semiconductor region 7A thereby forming an n+ type semiconductor region 14 which is the n type emitter region. The n type impurities introduced to each of the collector lead-out electrode 13A and the emitter lead-out electrode 13C are introduced, for example, using As and by means of ion implantation or thermal diffusion.

Each of the collector lead-out electrode 13A and the emitter lead-out electrode 13C may also be formed by depositing a silicon film until each of the inside of the collector opening 11A and the emitter opening 11C is filled by means of a CVD process and, subsequently, removing the silicon film by a portion corresponding to the thickness of the deposited film by anisotropic etching.

Figure 25:
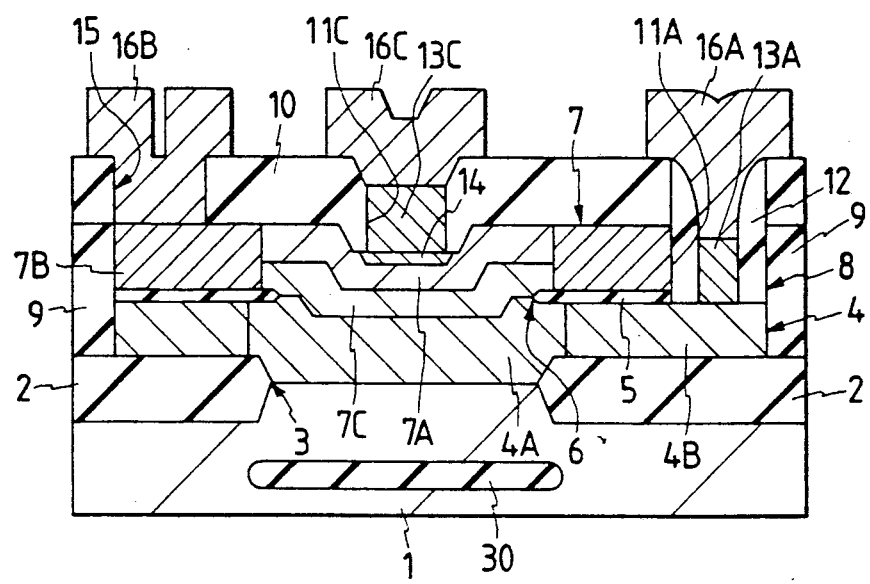
FIG. 25 is a cross sectional view for a portion illustrating the constitution of a bipolar transistor as a fourth embodiment according to the present invention.

Then, as shown in FIG. 25, a base opening 15 is formed to the insulation film 10 in a region for forming the base lead-out electrode. The base opening 15 is formed, for example, by anisotropic etching.

Then, wirings 16A, 16C and 16B connected to the collector leasing electrode 13A, the emitter lead-out electrode 13C and the base lead-out electrode 7B respectively are formed.

Subsequently, final protection films such as a silicon oxide film or silicon nitride film, or a plurality of layers of wirings are formed as the upper layer for the wirings 16A, 16B and 16C, and the bipolar transistor of vertical structure is thus completed by forming the final protection film to the upper layer of the wirings.

In the present invention, boron nitride film (BN) having lower dielectric constant as compared with the silicon oxide film may be used for each of the insulators 2, 5, 9 and 12.

Further, in the present invention, the collector lead-out region 4B may be formed only to a portion at the periphery of the n+ type semiconductor region 4A as the n type collector region. Similarly, in the present invention, the base lead-out electrode 7B may be formed to a portion at the periphery of the p type semiconductor region 7A which is the p type base region.

In this way, in the semiconductor integrated circuit device having a bipolar transistor of vertical structure in which the n type collector region is formed on the p− type semiconductor substrate (silicon substrate) 1 which is a device isolation region, the collector lead-out region 4B formed with the identical silicon film 4 with the n type collector region is formed at least to a portion of the periphery of the n type collector region (n+ type semiconductor region 4A) of the bipolar transistor of vertical structure, and the insulator 2 is formed between the collector lead-out region 4B and the p− type semiconductor substrate 1. With such a constitution, since the parasitic capacitance formed between the collector lead-out region 4B and the p− type semiconductor substrate 1 is reduced, and the parasitic capacitance ($C_{TS}$) added to the n type collector region of the bipolar transistor of vertical structure can be reduced, it is possible to increase the operation speed of the bipolar transistor of vertical structure and improve the operation speed of a semiconductor integrated circuit device. Further, since area of the depletion region formed to the pn junction between the n type collector region (n+ type semiconductor region 4A) and the collector lead-out region 4B and the p− type semiconductor substrate 1 can be reduced by so much as the area of the collector lead-out region 4B, it is possible to reduce the trapping amount of minor carriers generated upon incident of α-rays in the p type semiconductor substrate 1, and the rate of occurrence of α-ray soft errors can be reduced in the semiconductor integrated circuit device. Further, since a heat dissipation path (opening 3) extending from the n type collector region to the p− type semiconductor substrate 1 is formed just below the n type collector region, it is possible to improve the efficiency of dissipating heat generated upon operation of the bipolar transistor of vertical structure. The improvement of the heat dissipation efficiency can lower the operation temperature of a bipolar transistor of vertical structure to improve electric characteristics such as lowering of electric resistance, or prevent the disconnection of the wiring 16 due to electromigration, etc. thereby improving the electric reliability.

Further, in a semiconductor integrated circuit device having a bipolar transistor of vertical structure in which the n type collector region is formed on the p− type semiconductor substrate 1 which is a device isolation region, a collector lead-out region 4B formed with an identical silicon film 4 with the n type collector region is formed at least to a portion at the periphery of the n type collector region of the bipolar transistor of vertical structure, and substantially the entire surface of the collector lead-out region 4B is coated with the insulators 2, 5 and 9. With this constitution, since the addition of the parasitic capacitance formed between the conductive film (for example, base lead-out electrode 7B) at the periphery of the collector lead-out region 4B and the collector lead-out region 4B to the collector lead-out region 4B can be reduced, in addition to the effect described above, the parasitic capacitance added to the n type collector region of the bipolar transistor of vertical structure can be reduced further to thereby further increase the operation speed of the semiconductor integrated circuit device.

Further, in a semiconductor integrated circuit device having a bipolar transistor in which the base lead-out electrode is connected to the periphery of the base region, the p type base region (p type semiconductor region 7A) of the bipolar transistor and the base lead-out electrode 7B are formed with the identical silicon film 7 and the width of the p type base region is made smaller than the thickness of the base lead-out electrode 7B. With such a constitution, since it is possible to decrease the resistance value of the base electrode 7B, decrease the serial resistance ($r_{bb}'$) of the base current path, and the base width $W_B$ can also be reduced to improve the cut-off frequency $f_T$, it is possible to increase the operation speed of the bipolar transistor and increase the operation speed of the semiconductor integrated circuit device. Furthermore, since the profile for the impurity concentration in the p type base region can be made steep, and the intensity of electric field formed in the pn junction between the p type semiconductor region 7B as the p type base region and the n type semiconductor region 7C as the n type collector region can be increased to improve the carrier transportation efficiency, it is possible to improve the cut-off frequency ($f_T$) of the bipolar transistor and increase the operation speed of the semiconductor integrated circuit device.

Furthermore, in a semiconductor integrated circuit device having the bipolar transistor of vertical structure in which each of the n type collector region and the p type base region is successively arranged in the vertical direction on the p$^-$ type semiconductor substrate 1, the collector lead-out region 4B formed with the identical silicon film 4 with the n type collector region is formed at least to a portion at the periphery of the n type collector region (n$^+$ type semiconductor region 4A) of the bipolar transistor of vertical structure, the base lead-out electrode 7B formed with the identical silicon film 7 with the p type base region is formed at least to a portion at the periphery of the p type base region (p type semiconductor region 7A), the insulator 2 is formed between the collector lead-out electrode 4B and the p$^-$ type semiconductor substrate 1, and the insulator 5 is formed between the collector lead-out region 4B and the base lead-out electrode 7B. With such a constitution, since the parasitic capacitance formed between the collector lead-out region 4B and the base lead-out electrode 7B can be reduced and addition of the parasitic capacitance to each of the n type collector region and the p type base region of the bipolar transistor of vertical structure can be reduced, in addition to the effect as described above, it is possible to increase the operation speed of the bipolar transistor of vertical structure and also increase the operation speed of a semiconductor integrated circuit device. Further, the base lead-out electrode 7B and the collector lead-out region 4B can be separated from each other by the insulator 5, and the profile for the impurity concentration in the base lead-out electrode 7B can be increased independently of the collector lead-out electrode 4B. As a result, since the resistance value of the base lead-out electrode 7B can be reduced and the serial resistance of the base current path can be reduced, it is possible to increase the operation speed of the bipolar transistor of vertical structure and increase the operation speed of semiconductor integrated circuit device.

Further, each of the planar shape for the opening 3 the periphery of which is defined with the insulator 2 for connecting the p type collector region (n$^+$ type semiconductor region 4A) and the p type semiconductor substrate 1 and the planar shape for the opening 6 the periphery of which is defined with the insulator 5 for connecting the n type collector region (n$^+$ type semiconductor region 4A) and the p type base region (p type semiconductor 7A) is constituted to such a shape formed by a treatment of widening by a predetermined amount of size relative to the planar shape for the entire emitter region 14 of the bipolar transistor of vertical structure. With such a constitution, in a case of designing a bipolar transistor of vertical structure by CAD processing, since each of the shape for the opening 3 and the shape for the opening 6, that is, the planar shape for the p type base region or the planar shape for the n type collector region can be defined by merely applying lessening treatment (minimizing treatment) or broadening treatment (enlarging treatment) to the planar shape of the n type emitter region, graphic processing can be simplified and the time required for the development of the semiconductor integrated circuit device can be shortened.

Further, in a method of manufacturing a semiconductor integrated circuit device having the bipolar transistor of vertical structure in which the n type collector region is formed on the p$^-$ type semiconductor substrate 1 which is a device isolation region, there are provided a step of forming the insulator 2 to the periphery of the region forming the n type collector region (n$^+$ type semiconductor region 4A) on the p$^-$ type semiconductor substrate 1, a step of depositing the silicon film 4 by means of a CVD process on the insulator 2 and on the p$^-$ type semiconductor substrate 1 which is exposed being surrounded with the insulator 2 (exposed through the opening 3), and a step of introducing n type impurities of the conduction type opposite to that of the p$^-$ type semiconductor substratae 1 into each of the silicon film 4 (polycrystalline silicon film 4D) on the insulator 2 and the silicon film 4 (monocrystalline film 4C) on the p$^-$ type semiconductor substrate 1, forming the collector lead-out electrode 4B with the silicon film 4 on the insulator 2 and forming the n type collector region (n$^+$ type semiconductor region 4A) with the silicon film 4 on the p$^-$ type semiconductor substrate 1. With the constitution as described above, since the collector lead-out electrode 4B can be formed in the step of forming the n type collector region (n$^+$ type semiconductor region 4A) of the bipolar transistor of vertical structure, the number of steps for manufacturing the semiconductor integrated circuit device can be reduced by so much as that corresponds to the step of forming the collector lead-out electrode 4B.

Further, in the method of manufacturing a semiconductor integrated circuit device having a bipolar transistor of vertical structure in which each of the n type collector region and the p type base region is successively arranged in the vertical direction on the p$^-$ type semiconductor substrate 1 which is a device isolation region, there are provided a step of forming the insulator 2 to the periphery of the region for forming the n type collector region (n+ type semiconductor region 4A) on the p− type semiconductor substrate 1, a step of depositing the silicon film 4 by means of a CVD process on the insulator 2 and on the p− type semiconductor substrate 1 which is exposed by being surrounded with the periphery thereof with the insulator 2, a step of introducing n type impurities of the conduction type opposite to that of the p− type semiconductor substrate 1 into each of the silicon film 4 (polycrystalline silicon film 4D) on the insulator 2 and the silicon film 4 (monocrystalline silicon film 4C) on the p− type semiconductor substrate 1, forming the collector lead-out electrode 4B with the silicon film 4 on the insulator 2 and forming the n+ collector region with the silicon film 4 on the p− type semiconductor substrate 1, a step of forming the insulator on the collector lead-out region 4B, a step of depositing the silicon film 7 by means of a CVD process on the insulator 5 and on the n type collector region (n+ type semiconductor region 4A) which is exposed by being surrounded with the insulator 5, and a step of introducing p type impurities of the conduction type opposite to that of the n type collector region into each of the silicon film 7 (polycrystalline silicon film 7E) on the insulator 5 and the silicon film 7 (single crystal silicon film 7D) on the n type collector region, forming the base lead-out electrode 7B with the silicon film 7 on the insulator 5 and forming the p type base region (p type semiconductor region 7A) with the silicon film 7 on the n type collector region. With the constitution as described above, since the base lead-out electrode 7B can be formed by the step of forming the p type base region (p type semiconductor region 7A) of the bipolar transistor of vertical structure, the number of manufacturing steps for the semiconductor integrated circuit device can be reduced by so much as that corresponds to the step of forming the base lead-out electrode 7B.

Furthermore, the silicon film 7 deposited on the n type collector region (n+ type semiconductor region 4A) and on the insulator 5 surrounding the periphery of the n type collector region is formed in a state free from the impurity introduction or with the opposite n type to the p type base region and, subsequently, p type impurities are introduced to the main surface of the n type collector region of the silicon film 7 to form the p type base region (p type semiconductor region 7A). With such a constitution described above, each of the p type base region (p type semiconductor region 7A) and the base lead-out electrode 7B can be formed dependently of each other and it is possible to form the p type base region with a shallow junction depth and form the base lead-out electrode 7B with a large thickness as compared with the junction depth in the p type base region. As a result, since the cut-off frequency of the bipolar transistor of vertical structure can be improved and the serial resistance of the base current path can be decreased, it is possible to increase the operation speed of the bipolar transistor of vertical structure and increase the operation speed of the semiconductor integrated circuit device.

FOURTH EMBODIMENT

This is the fourth embodiment of the invention in which the rate of occurrence of α-ray soft errors in the bipolar transistor of vertical structure in the third embodiment is further decreased.

Description will now be made to the constitution of a bipolar transistor mounted on a semiconductor integrated circuit device as the fourth embodiment according to the present invention with reference to FIG. 25 (cross sectional view for a portion).

The bipolar transistor of vertical structure in this embodiment is different, as shown in FIG. 25, from the third embodiment in that a burying insulator 30 is formed at the inside below the n type collector region (n+ type semiconductor region 4A) of a p− type semiconductor substrate 1. The burying insulator 30 has an effect of shielding electron-hole pairs formed by α-rays incident to the inside of the p− type semiconductor substrate 1, in particular, holes intruding into the n type collector region. As the burying insulator 30 is formed nearer to the n type collector region on the surface of the p− type semiconductor substrate 1, the trapping amount of holes in the n type collector region can be reduced more. Fundamentally, the burying insulator 30 is formed at the inside of the p− type semiconductor substrate 1 in a portion from the surface of the p− type semiconductor substrate 1 to a position in which the surfaces in contact with a depletion region formed from the pn junction in the n+ type semiconductor region 4A of the n type collector region and the p− type semiconductor substrate 1 on the side of the p− semiconductor substrate 1. When the n type impurities of the n+ type semiconductor region 4A are diffused through the opening 3 the periphery of which is defined with the insulator 2 to the main surface of the p− type semiconductor substrate 1, since the n type impurities diffused to the main surface of the p− type semiconductor substrate 1 are set to a higher impurity concentration as compared with the impurity concentration in the p− type semiconductor substrate 1, they constitute a portion of the n type collector region. That is, the burying insulator 30 is formed at the inside of the p− type semiconductor substrate 1 at a portion from the pn junction of the n type collector region formed to the main surface of the p− type semiconductor substrate 1 with the n type impurity diffused from the n+ type semiconductor region 4A and the p− type semiconductor substrate 1 to a position in which it is in contact with the depletion region formed on the side of the p− type semiconductor substrate 1.

Further, as the size of the burying insulator 30 is greater as compared with the planar size for the n type collector region, the trapping amount of the holes in the n type collector region can be reduced further.

The method of manufacturing the bipolar transistor of vertical structure will now be described with reference to FIG. 26 (cross sectional view for a portion in a predetermined manufacturing step).

Figure 16:
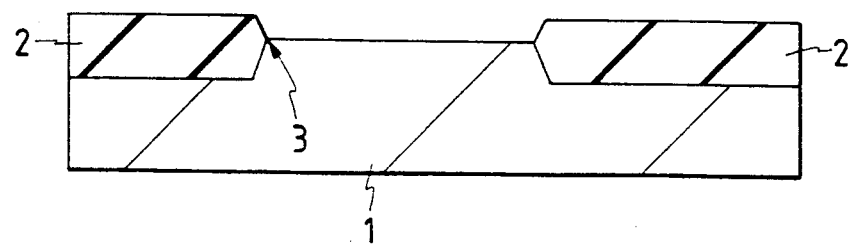
Figure 26:
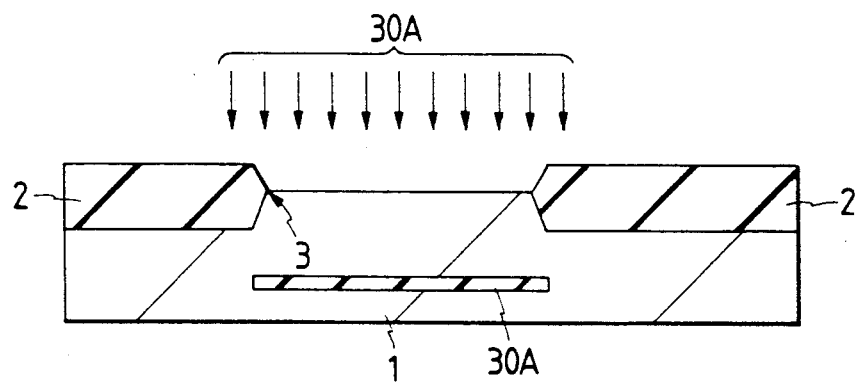
FIG. 26 is a cross sectional view for a portion illustrating the method of manufacturing the bipolar transistor shown in FIG. 25.

Subsequent to the step for forming the insulator 2 shown in FIG. 16 for the third embodiment, oxygen ions 30A are introduced to the inside of the p− type semiconductor substrate 1 as shown in FIG. 26. The oxygen ions 30A are introduced by ion implantation at high energy using the insulator 2 and a mask not illustrated formed thereover. As a mask, a photoresist film formed by photolithography is used for instance. The opening size of the mask is made greater, at least by an amount of mask misalignment in the manufacturing step, as compared with the planar size for the opening 3 the periphery of which in defined with the insulator 2. As a result, the oxygen ions 30A are introduced to the inside of the p− type semiconductor substrate 1 substantially in selfalignment to the opening 3.

Then, a heat treatment is applied to bond the oxygen ions 30A introduced as described above and silicon in the p⁻ type semiconductor substrate 1, and a burying insulator 30 composed of silicon oxide is formed as shown in FIG. 26.

Subsequently, the bipolar transistor of vertical structure in the fourth embodiment is completed by applying the step shown in FIG. 17 explained for the third embodiment and subsequent steps.

Figure 27:
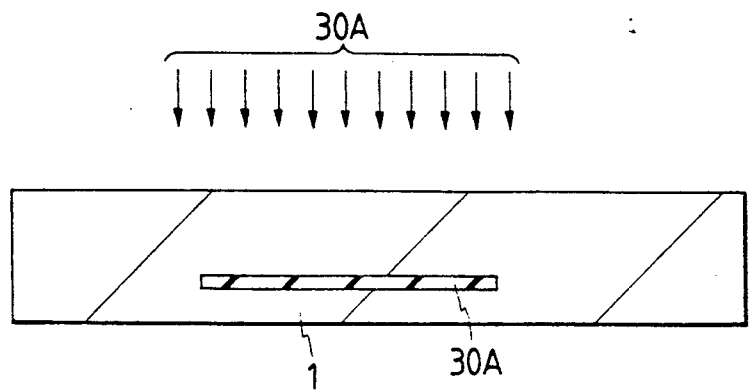
FIG. 27 is a cross sectional view for a portion illustrating another method of manufacturing the bipolar transistor shown in FIG. 25.

Further, the burying insulator 30 may also be formed by the following manufacturing method as shown in FIG. 27 (across sectional shape for a portion in a predetermined manufacturing step).

Before (or after) forming the silicon oxide film shown in FIG. 15 for the third embodiment, oxygen ions 30A are introduced to inside of the p⁻ type semiconductor substrate 1 in the region for forming the n type collector region in the bipolar transistor of vertical structure. The oxygen ions 30A are introduced by ion implantation in the same way as described above.

Subsequently, a heat treatment is applied in the same way as described for FIG. 26, to form the burying insulator 30.

Figure 28:
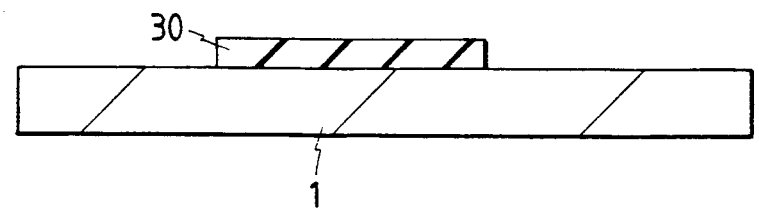
FIG. 28 through FIG. 30 are cross sectional views each for a portion illustrating other method of manufacturing the bipolar transistor shown in FIG. 25.
Figure 29:
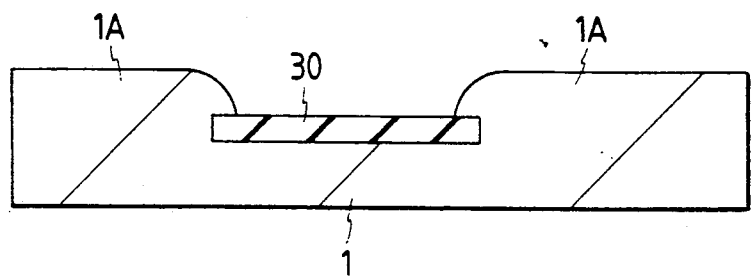
Figure 30:
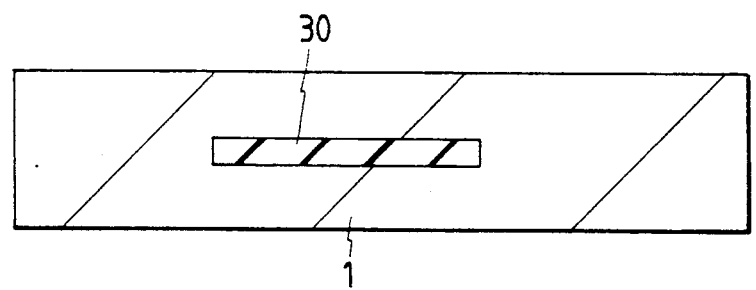

The burying insulator 30 may also be formed by the following manufacturing method as shown in FIGS. 28 through 30 (cross sectional view for a portion shown on every manufacturing steps).

At first, a p⁻ type semiconductor substrate 1 is prepared and a burying insulator 30 is formed on a region forming the n⁺ collector region of the p⁻ type semiconductor substrate 1. The burying insulator 30 is formed, for example, with a silicon oxide film formed by thermal oxidation or deposited by CVD or sputtering and by patterning with photolithography.

Then, as shown in FIG. 29, selective epitaxial growing is applied to grow monocrystalline silicon 1A on the surface of the p⁻ type semiconductor substrate 1 exposed from the burying insulator 30. The monocrystalline silicon 1A springs up on the surface of the burying insulator 30 from the periphery to the central portion of the burying insulator 30 to coat the burying insulator 30. That is, the burying insulator 30 is effectively buried to the inside of the p⁻ type semiconductor substrate 1.

Then, as shown in FIG. 30, the surface of the p⁻ type semiconductor substrate 1 is polished to complete a p⁻ type semiconductor substrate 1 disposed with the burying insulator 30.

Subsequently, a bipolar transistor of vertical structure is completed by successively applying the manufacturing steps explained for the third embodiment.

As described above, in a semiconductor integrated circuit having a bipolar transistor of vertical structure in which the n type collector region is formed on the p⁻ type semiconductor substrate 1 which is a device isolation region, a collector lead-out electrode 4B formed with the identical silicon film 4 as the n type collector region is formed at least to a portion of the periphery of the n type collector region (n⁺ type semiconductor region 4A) of the bipolar transistor of vertical structure, the insulator 2 is disposed between the collector lead-out electrode 4B and the p⁻ type semiconductor substrate 1 and the burying insulator 30 is formed at the inside below the n type collector region (n⁺ type semiconductor region 4A) of the p⁻ type semiconductor substrate 1. With the constitution described above, since the intrusion of the minor carrier formed by α-rays entering the inside of the p⁻ type semiconductor substrate 1 into the n type collector region can be shielded and the trapping amount of the minor carrier in the n type collector region can be reduced, it is possible to reduce the rate of occurrence of α-rays soft errors in the semiconductor integrated circuit device.

Further, the burying insulator 30 on the side of the surface of the p⁻ type semiconductor substrate 1 is formed in a range from the surface of the p⁻ type semiconductor substrate 1 to a position in contact with the depletion region which is formed from the pn junction between the p⁻ type semiconductor substrate 1 and the n type collector region (n⁺ type semiconductor region 4A) to the side of the p⁻ type semiconductor substrate. With this constitution, since the parasitic capacitance formed to the pn junction between the p⁻ type semiconductor substrate 1 and the n⁺ collector region (n⁺ type semiconductor region 4A) can be reduced by so much as that corresponds to the burying insulator 30 and the parasitic capacitance added to the n type collector region of the bipolar transistor of vertical structure can be reduced, it is possible to increase the operation speed of the bipolar transistor of vertical structure and increase the operation speed of the semiconductor integrated circuit device. Further, since the burying insulator 30 is properly aparted from the n⁺ collector region, a heat dissipation path lead-out from the n type collector region to the p⁻ type semiconductor substrate 1 can be ensured to improve the heat dissipation efficiency of the bipolar transistor of vertical structure.

FIFTH EMBODIMENT

This is the fifth embodiment according to the present invention in which each of the semiconductor integrated circuit devices in the third and the fourth embodiments is formed by semiconductor wafer bonding technology.

Description will now be made to the method of manufacturing a bipolar transistor mounted on a semiconductor integrated circuit device as the fifth embodiment according to the present invention with reference to FIGS. 31 through 33 (cross sectional views for a portion shown on every manufacturing steps).

Figure 31:
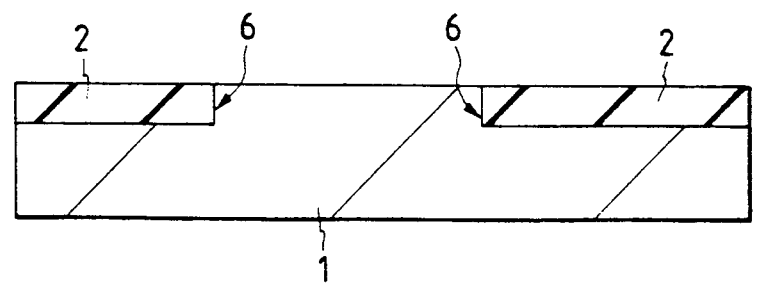
FIG. 31 through FIG. 33 are cross sectional views each for a portion illustrating a method of manufacturing a bipolar transistor as a fifth embodiment according to the present invention.

At first, after forming an insulator shown in FIG. 16 of the third embodiment, mirror face polishing treatment is applied to the surface of the p⁻ type semiconductor substrate 1 and the surface of the insulator 2 to flatten the surface of the p⁻ type semiconductor substrate 1 including the insulator 2 as shown in FIG. 31. The p⁻ type semiconductor substrate 1 is in a state of a semiconductor wafer not applied with a dicing step.

Figure 32:
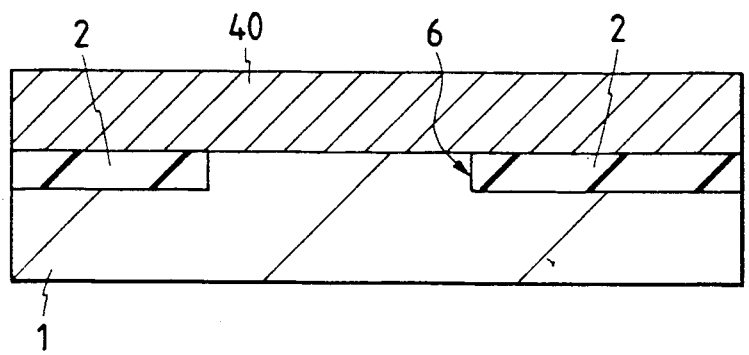

Then, as shown in FIG. 32, another semiconductor wafer 40 applied with the mirror face polishing treatment on the surface in the same manner is bonded to the surface of the p⁻ type semiconductor substrate 1. The semiconductor wafer 40 is, basically, formed with monocrystalline silicon like that in the p⁻ type semiconductor substrate 1.

Figure 33:
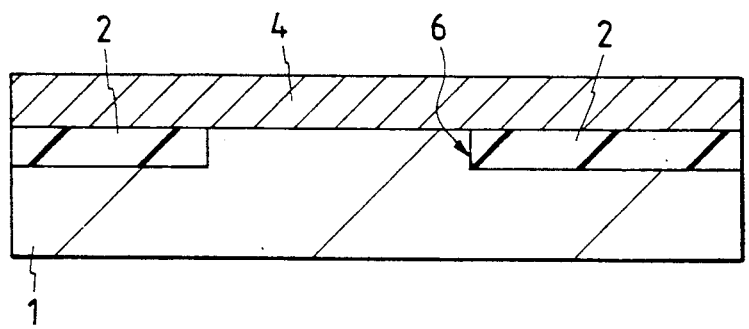

Then, the semiconductor wafer 40 is polished from the rear face and, as shown in FIG. 33, a silicon film 4 is formed. Since the silicon film 4 is formed by polishing the semiconductor wafer 40 comprising monocrystalline silicon, it is formed with single crystals on the active region of the p⁻ type semiconductor substrate 1 and on the insulator 2.

Subsequently, by applying the step shown in FIG. 18 of the third embodiment and the succeeding steps, the bipolar transistor of vertical structure in this embodiment is completed.

In this way, the semiconductor wafer 40 is bonded on the surface of the p⁻ type semiconductor substrate 1 and the rear face of the semiconductor wafer 40 is polished to form the silicon film 4. With the constitution as described above, the entire area of the silicon film 4 is formed with monocrystalline silicon and each of the operation region (intrinsic region) of the bipolar transistor of vertical structure and the lead-out electrode can be formed in any of the regions of the silicon film 4.

Further, the bipolar transistor or other passive elements, for example, Shottky barrier diode element can be formed in any of the regions of the silicon film 4.

SIXTH EMBODIMENT

This is a sixth embodiment of the present invention in which the rate of occurrence of α-ray soft errors is reduced in each of the bipolar transistors of vertical structure for the third and the fourth embodiments.

Description will now be made to the method of manufacturing a bipolar transistor mounted on a semiconductor integrated circuit device as the sixth embodiment of the present invention with reference to FIG. 22 through FIG. 24 (cross sectional views for a portion illustrating on every manufacturing steps).

Figure 34:
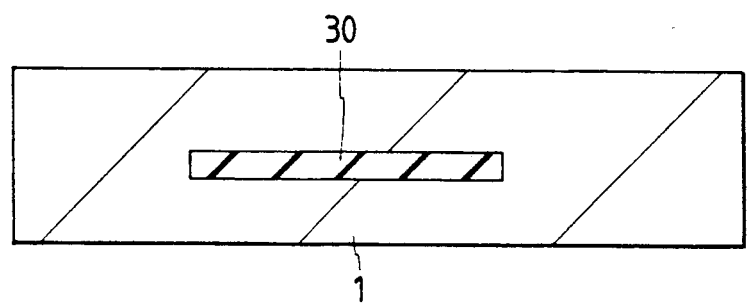
FIG. 34 through FIG. 36 are cross sectional views each a portion illustrating a method of manufacturing a bipolar transistor as a sixth embodiment according to the present invention.

At first, a p⁻ type semiconductor substrate 1 disposed with a burying insulator 30 is formed as shown in FIG. 34 by using the manufacturing method described for the fifth embodiment.

Then, a groove 31 is formed to the surface of the inactive region of the p⁻ type semiconductor substrate 1. The groove 31 surrounds the periphery of the active region of the bipolar transistor of vertical structure and it is formed with a size somewhat greater than the planar size of the active region. Further, the groove 31 is formed to a depth substantially equal with or somewhat greater than that of the insulator 30. The groove 31 is formed, for example by anisotropic etching such as dry etching using, a mask (photoresist film) formed by photolithography.

Figure 35:
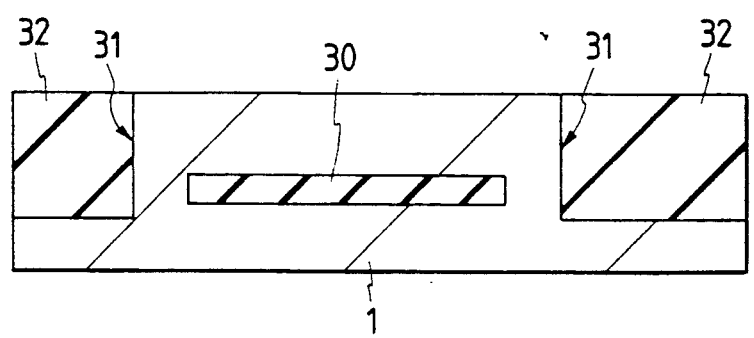

Then, as shown in FIG. 35, an insulator 32 is buried within the groove 31. The insulator 32 is formed, for example, by depositing a silicon oxide film to a thickness of substantially filling the groove 31 by means of a CVD process and applying anisotropic etching such as RIE to the silicon oxide film for a portion corresponding to the deposited film thickness.

Figure 36:
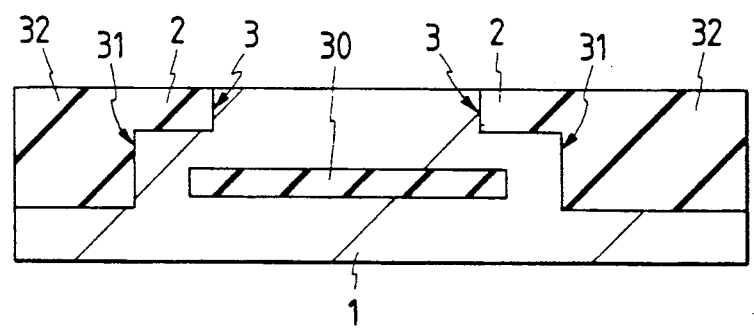

Then, an insulator 2 is formed on the main surface of the inactive region of the p⁻ type semiconductor substrate 1 as shown in FIG. 36 like that in the third embodiment.

Subsequently, by applying the steps as shown in FIG. 17 explained for the third embodiment and the subsequent steps, the bipolar transistor of vertical structure in this embodiment is completed.

In this way, the burying insulator 30 is formed to the inside of the p⁻ type semiconductor substrate 1 below the n type collector region (n⁺ type semiconductor region 4A) of the bipolar transistor of vertical structure, the groove 31 is formed to the surface at the periphery of the n type collector region of the p⁻ type semiconductor substrate 1 and the insulator 32 is formed in the groove 31. With the constitution as described above, when the p⁻ type semiconductor substrate 1 is viewed linearly from the n type collector region (n⁺ type semiconductor region 4A) of the bipolar transistor of vertical structure through the opening the periphery of which is defined with the insulator 2, it is entirely surrounded with the burying insulator 2 and the insulator 32 burying in the groove 31, and the portion between the n type collector region (n⁺ type semiconductor region 4A) and the p⁻ type semiconductor substrate 1 is shielded linearly. That is, among the α-rays incident from the surface to the inside of the p⁻ type semiconductor substrate 1, minor carriers (holes) formed by α-rays incident to the inside of the p⁻ type semiconductor substrate 1 are scarcely trapped by the n type collector region owing to the insulator 2 and the insulator 32. Accordingly, since the amount of the minor carriers formed at the inside of the p⁻ type semiconductor substrate and trapped in the n type collector region can be reduced below the n⁺ collector region and at the periphery thereof of the bipolar transistor of vertical structure, the rate of occurrence of α-ray soft errors in the semiconductor integrated circuit device can be reduced further.

While the invention made by the present inventor has been explained specifically referring to the embodiments, it will be apparent that the present invention is not restricted only to such embodiments but may be modified variously within a scope not departing from the gist thereof.

For instance, the present invention can be applied to a reverse direction bipolar transistor of vertical structure in which each of n type emitter region, p type base region and n type collector region are successively arranged on a p⁻ type semiconductor substrate 1.

Further, the present invention can be applied to a bipolar transistor of vertical structure in which p⁺ type collector region, n⁺ type base region and p type emitter region are successively arranged on an n⁻ type semiconductor substrate.

Further, the present invention can be applied to a hybrid type semiconductor integrated circuit device having a bipolar transistor and a MISFET (or complmentary MISFET) on an identical silicon substrate. In this case, the bipolar transistor can be formed in the same manner as in the previous embodiments described before and MISFET can be formed by forming a source region and a drain region to the silicon film 4 or 7.

Furthermore, the dual layered base lead-out electrodes 7B, 70B and the pedestal collector layer 7C in the first embodiment can be applied to the bipolar transistor of the third embodiment. In this case, the dual layered silicon film 7, 70 may be formed after forming the silicon film 2 (collector region 4A, lead-out region 4B) and the insulator 5.

Advantageous effects obtained according to the typical inventions disclosed in the present application are briefly explained as below.

The operation speed of the semiconductor integrated circuit device can be increased.

The rate of occurrence of α-ray soft errors in the semiconductor integrated circuit device can be reduced.

The heat dissipation efficiency in the semiconductor integrated circuit device can be improved.

The time required for the development of the semiconductor integrated circuit device can be shortened.

The number of manufacturing steps for the semiconductor integrated circuit device can be reduced.

What is claimed is:

1. A semiconductor integrated circuit device having a bipolar transistor in which a base lead-out electrode is connected to a periphery portion of a base region, comprising:

a semiconductor substrate of a monocrystalline silicon and having a main surface;

an isolation oxide layer selectively formed on said main surface to surround an active region of said main surface; and a dual layered silicon film having a first silicon film and a second silicon film each formed successively on said active region and on said isolation oxide layer, wherein the base region of the bipolar transistor is formed in the second silicon film of said dual layered silicon film over said active region and wherein each of said first silicon film and said second silicon film forms over said isolation oxide layer and said first silicon film and said second silicon film form the base lead-out electrode.

2. A semiconductor integrated circuit device according to claim 1, wherein the portion of each of the first silicon film and the second silicon film of the dual layered silicon film formed on said active region is monocrystalline and the portion of each of the first and silicon film and the second silicon film formed on the isolation oxide layer is polycrystalline.

3. A semiconductor integrated circuit device according to claim 1, wherein the second silicon film of the dual layered silicon film is formed with a compound of silicon and germanium.

4. A semiconductor integrated circuit device having at least one bipolar transistor comprising:

(a) a semiconductor substrate of a monocrystalline silicon having a main surface;

(b) an isolation oxide layer selectively formed on said main surface to surround an active region of said main surface;

(c) a first silicon layer formed on said active region and extending over said isolation oxide layer;

(d) a collector region of a bipolar transistor formed in said first silicon layer over said active region; and (e) a collector lead-out region of said bipolar transistor formed in said first silicon layer over said isolation oxide layer, wherein said collector region and said collector lead-out region are electrically connected to each other in said first silicon layer, and wherein emitter and base regions of said bipolar transistor are formed in a second silicon layer stacked on said first silicon layer.

5. A semiconductor integrated circuit device according to claim 4, wherein the collector region is monocrystalline and the collector lead-out region is polycrystalline.

6. A semiconductor integrated circuit device having a bipolar transistor in which a base lead-out electrode is connected to the periphery of a base region, comprising:

a dual layered silicon film having a first silicon film and a second silicon film each formed successively over an active region of a semiconductor substrate, wherein the base region of the bipolar transistor and the base lead-out electrode are formed with said second silicon film which overlies said first silicon film and the junction depth of said base region within said second silicon film is made shallower than the thickness of the base-lead-out electrode within said second silicon film.

7. A semiconductor integrated circuit device according to claim 6, wherein the base region is monocrystalline and the base lead-out electrode is polycrystalline.

* * * * *

UNITED STATES PATENT AND TRADEMARK OFFICE
CERTIFICATE OF CORRECTION

PATENT NO. : 5,073,810
DATED : December 17, 1991
INVENTOR(S) : Nobuo Owada, et al.

It is certified that error appears in the above-identified patent and that said Letters Patent is hereby corrected as shown below:

Title page, item (75) inventors: Sekiko Ozono, Ozono"
should read -- Seiko Ozono, Akishima --.

Signed and Sealed this

Ninth Day of March, 1993

Attest:

STEPHEN G. KUNIN

Attesting Officer

Acting Commissioner of Patents and Trademarks